United States Patent
Ting et al.

(10) Patent No.: US 10,177,113 B2
(45) Date of Patent: Jan. 8, 2019

(54) METHOD OF MASS TRANSFERRING ELECTRONIC DEVICE

(71) Applicant: Genesis Photonics Inc., Tainan (TW)

(72) Inventors: Shao-Ying Ting, New Taipei (TW); Yan-Ting Lan, Tainan (TW); Jing-En Huang, Tainan (TW); Yi-Ru Huang, Tainan (TW)

(73) Assignee: Genesis Photonics Inc., Tainan (TW)

( * ) Notice: Subject to any disclaimer, the term of this patent is extended or adjusted under 35 U.S.C. 154(b) by 0 days.

(21) Appl. No.: 15/680,225

(22) Filed: Aug. 18, 2017

(65) Prior Publication Data

US 2018/0053742 A1 Feb. 22, 2018

Related U.S. Application Data

(60) Provisional application No. 62/376,891, filed on Aug. 18, 2016.

(51) Int. Cl.
*H01L 21/683* (2006.01)
*H01L 21/78* (2006.01)
(Continued)

(52) U.S. Cl.
CPC .......... *H01L 24/97* (2013.01); *H01L 21/6836* (2013.01); *H01L 21/78* (2013.01);
(Continued)

(58) Field of Classification Search
CPC .......... H01L 21/6836; H01L 21/67253; H01L 21/67288; H01L 21/78; H01L 22/24;
(Continued)

(56) References Cited

U.S. PATENT DOCUMENTS

2011/0241064 A1 10/2011 Fang et al.
2011/0278634 A1 11/2011 Na et al.
(Continued)

FOREIGN PATENT DOCUMENTS

KR 20120079327 7/2012

OTHER PUBLICATIONS

"Office Action of US Related Application, U.S. Appl. No. 15/255,161", dated Oct. 5, 2017, p. 1-p. 24.
(Continued)

*Primary Examiner* — Brian Turner
(74) *Attorney, Agent, or Firm* — JCIPRNET

(57) ABSTRACT

A method of mass transferring electronic devices includes following steps. A wafer is provided. The wafer includes a substrate and a plurality of electronic devices. The electronic devices are arranged in a matrix on a surface of the substrate. The wafer is attached to a temporary fixing film. The wafer is cut so that the wafer is divided into a plurality of blocks. Each of the blocks includes at least a part of the electronic devices and a sub-substrate. The temporary fixing film is stretched so that the blocks on the temporary fixing film are separated from each other as the temporary fixing film is stretched. At least a part of the blocks is selected as a predetermined bonding portion, and each of the blocks in the predetermined bonding portion is transferred to a carrying substrate in sequence, so that the electronic devices in the predetermined bonding portion arc bonded to the carrying substrate. The sub-substrates of the blocks are removed. Another method of mass transferring electronic devices is also provided.

14 Claims, 38 Drawing Sheets

(51) Int. Cl.
   *H01L 27/15* (2006.01)
   *H01L 33/06* (2010.01)
   *H01L 33/60* (2010.01)
   *H01L 23/00* (2006.01)
   *H01L 25/075* (2006.01)
   *H01L 33/62* (2010.01)

(52) U.S. Cl.
   CPC ............. *H01L 24/81* (2013.01); *H01L 24/83* (2013.01); *H01L 25/0753* (2013.01); *H01L 33/62* (2013.01); *H01L 2221/68336* (2013.01); *H01L 2221/68363* (2013.01); *H01L 2224/81203* (2013.01); *H01L 2224/81805* (2013.01); *H01L 2224/81815* (2013.01); *H01L 2224/83851* (2013.01); *H01L 2224/95001* (2013.01); *H01L 2933/0066* (2013.01)

(58) Field of Classification Search
   CPC ........... H01L 22/20; H01L 2221/68381; H01L 2221/68327; H01L 2221/68377
   See application file for complete search history.

(56) References Cited

U.S. PATENT DOCUMENTS

| | | |
|---|---|---|
| 2012/0223345 A1 | 9/2012 | Tomoda et al. |
| 2012/0228580 A1 | 9/2012 | Wang et al. |
| 2014/0034976 A1 | 2/2014 | Chu et al. |
| 2014/0210054 A1* | 7/2014 | Kosub ................. H01L 23/5389 257/618 |
| 2014/0312369 A1 | 10/2014 | Yoon et al. |
| 2015/0028362 A1* | 1/2015 | Chan ..................... H01L 27/156 257/88 |
| 2015/0086301 A1* | 3/2015 | Rogers ................ H01L 21/6838 414/217 |
| 2015/0091787 A1 | 4/2015 | Ohmae et al. |
| 2015/0108492 A1 | 4/2015 | Kuo |
| 2015/0280065 A1* | 10/2015 | Wada .................... H01L 33/501 257/98 |
| 2015/0311415 A1 | 10/2015 | Song et al. |
| 2016/0111618 A1 | 4/2016 | Shur et al. |
| 2017/0018472 A1* | 1/2017 | Takamoto ............. H01L 23/293 |
| 2017/0092540 A1* | 3/2017 | Rohleder ................ H01L 21/82 |
| 2017/0229322 A1* | 8/2017 | Hsu ....................... H01L 21/568 |
| 2018/0090539 A1 | 3/2018 | Son et al. |
| 2018/0090639 A1 | 3/2018 | Ting et al. |

OTHER PUBLICATIONS

"Notice of Allowance of Related U.S. Appl. No. 15/680,227", dated Jul. 17, 2018, pp. 1-11.

"Office Action of Related U.S. Appl. No. 15/255,161", dated Aug. 7, 2018, pp. 1-17.

* cited by examiner

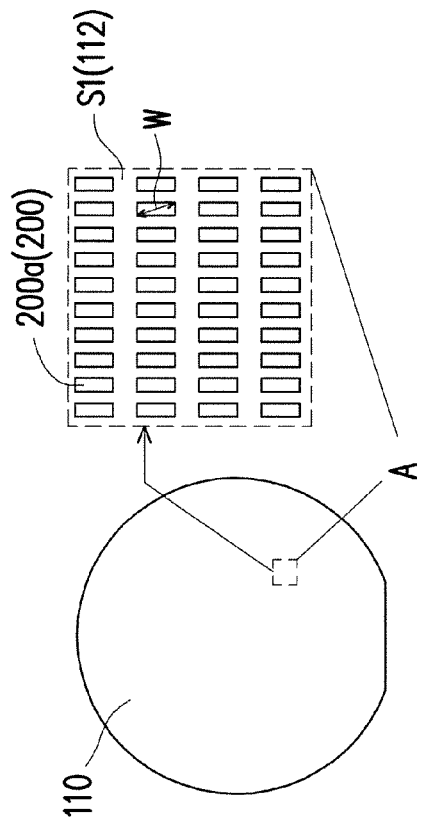
FIG. 2B
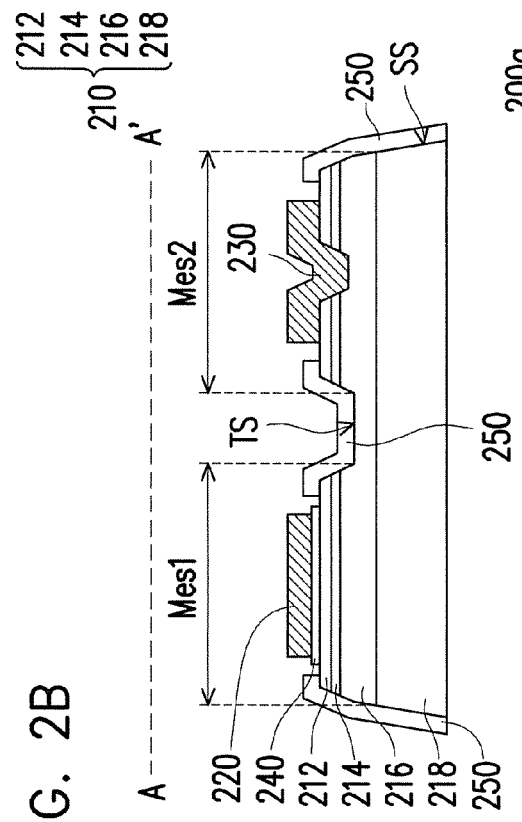
FIG. 2C
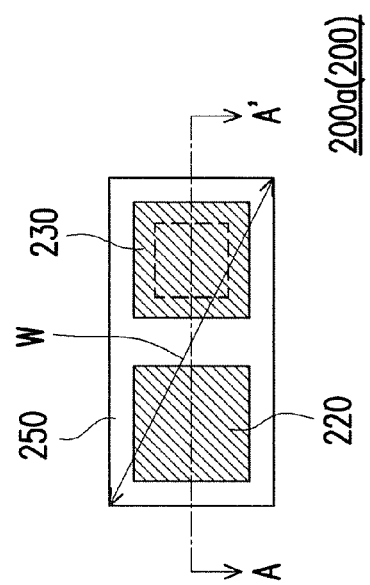

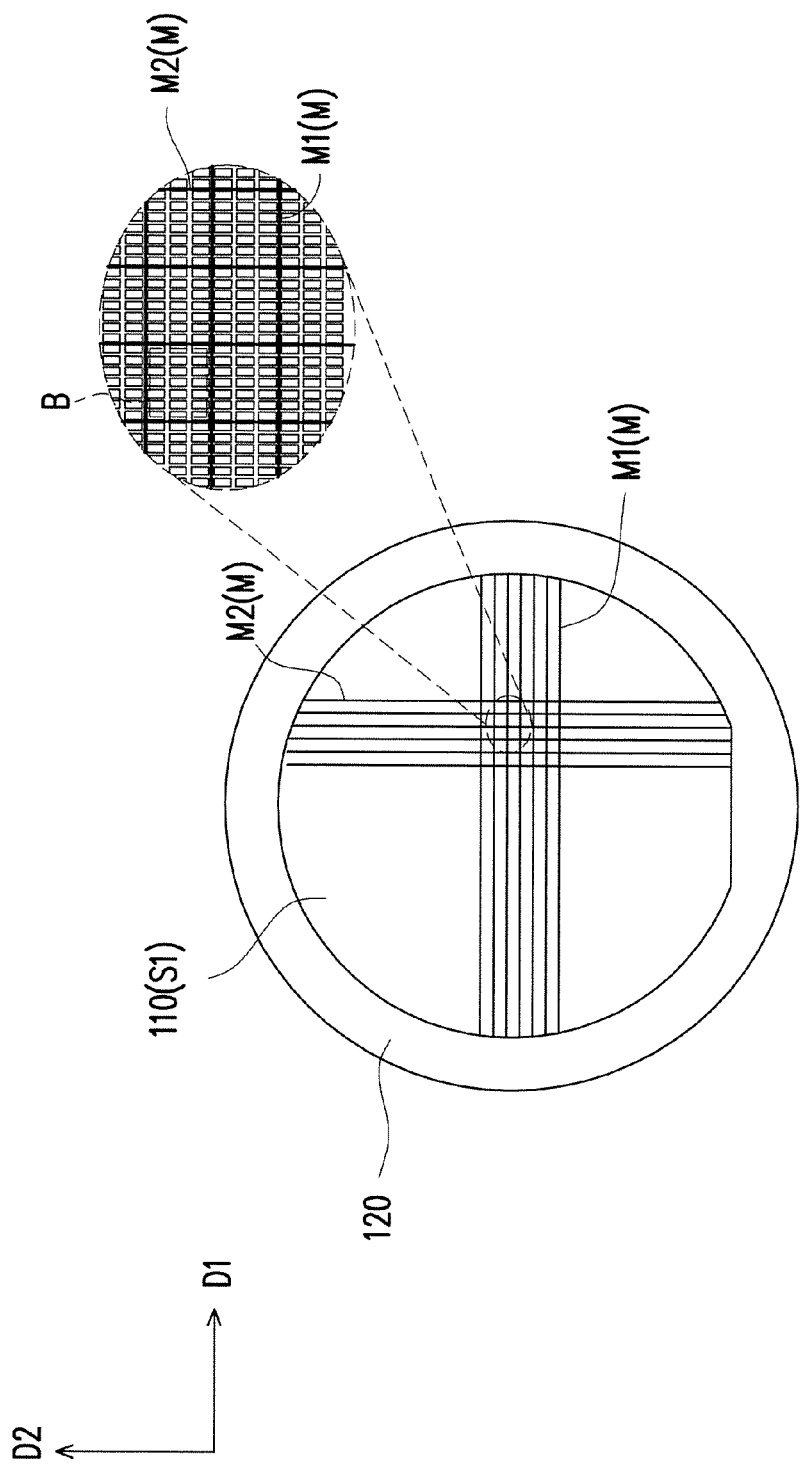

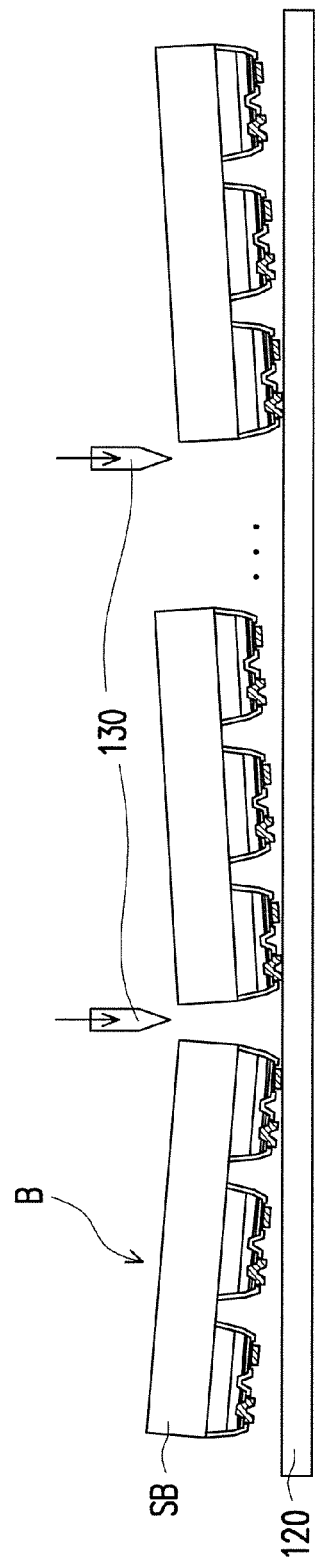

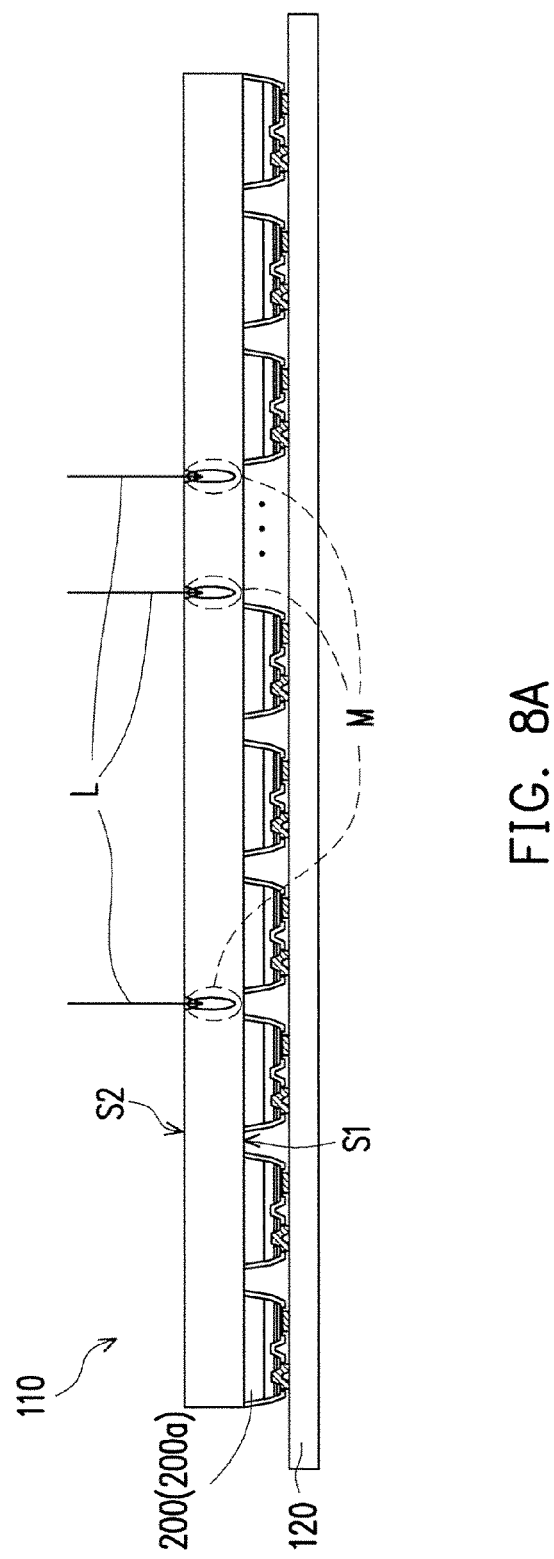

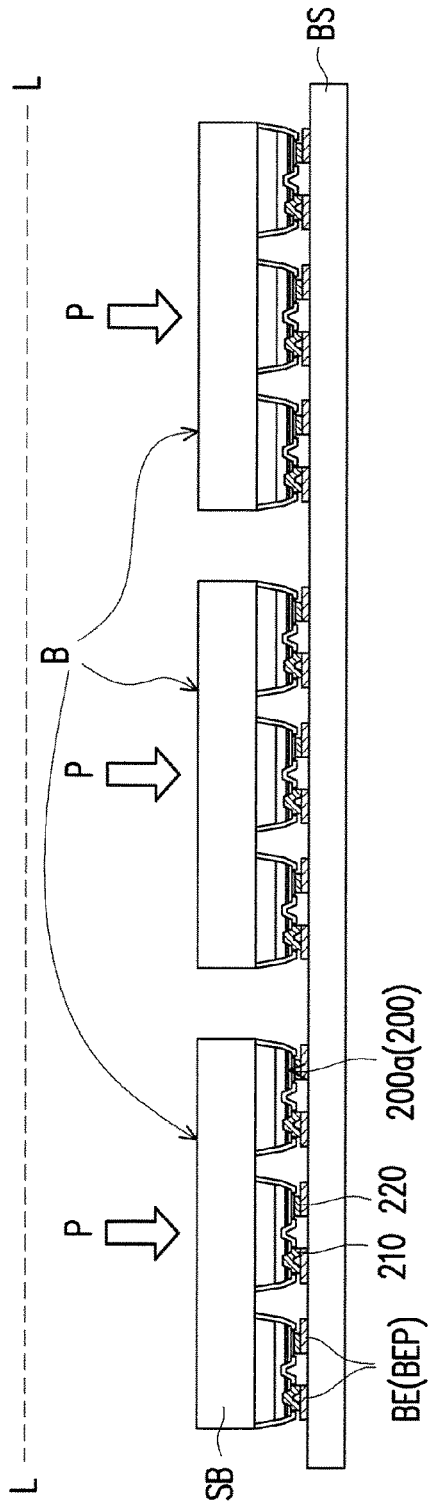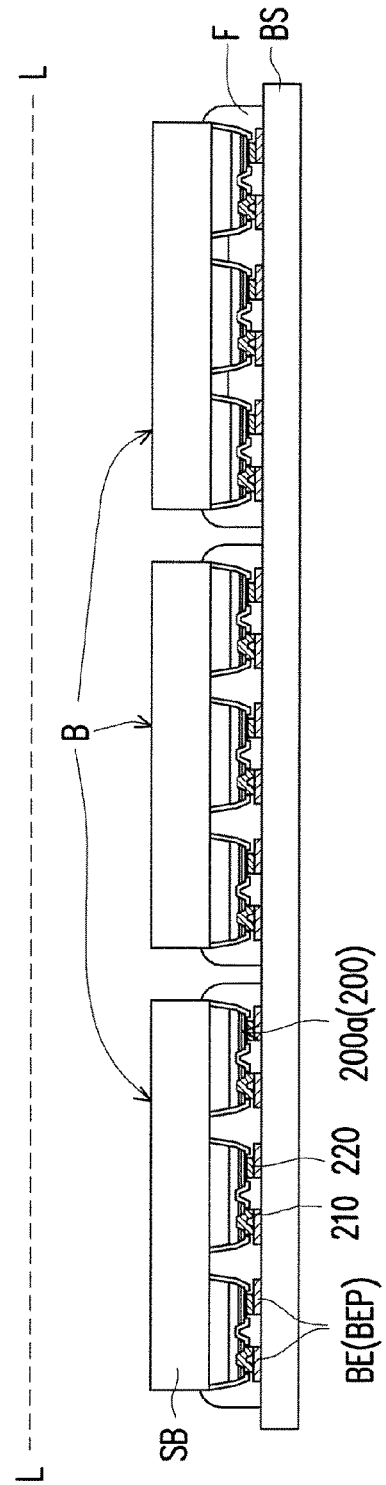

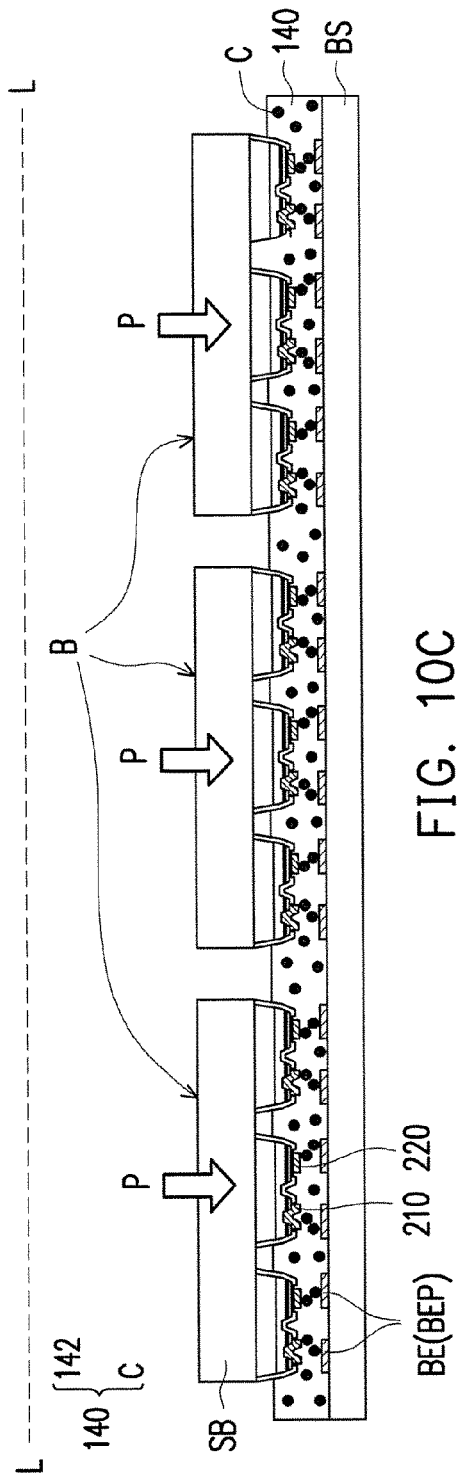
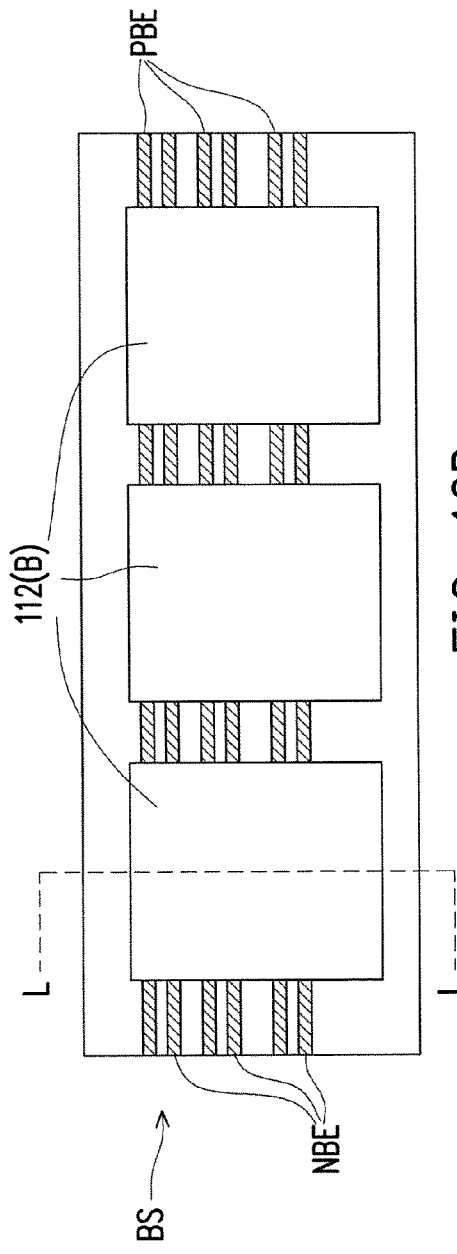
FIG. 10C
FIG. 10D

METHOD OF MASS TRANSFERRING ELECTRONIC DEVICE

CROSS-REFERENCE TO RELATED APPLICATION

The application claims the priority benefit of U.S. provisional application Ser. No. 62/376,891, filed on Aug. 18, 2016. The entirety of the above-mentioned patent application is hereby incorporated by reference herein and made a part of this specification.

FIELD OF THE INVENTION

The invention relates to a method of transferring electronic devices, and more particularly, to a method of mass transferring micro electronic devices.

DESCRIPTION OF RELATED ART

In recent years, a light-emitting diodes downsized from the original light-emitting diode size to microns has been developed in the technical field of light emitting diodes. This kind of light emitting diode is known as a micro light emitting diode (Micro LED; μLED). When the micro light emitting diode is applied in the field of display technology, each micro light emitting diode may serve as a sub-pixel in a display panel. This sort of display panel is known as a micro light emitting diode display panel (Micro LED display). With advantages of high luminous efficiency, long life and high resolution, the micro light emitting diode display panel is regarded as the mainstream of the next generation display technology.

Nonetheless, the current display panel is normally included with millions of pixels. Also, it is difficult to accurately align the micro light emitting diodes since the device size is real small. Therefore, if the micro light emitting diode needs to be aligned on a backplane of the display panel after being individually picked up, the cost is higher and the process time is overly long. On the hand, if all the micro light emitting diodes are directly transferred onto the backplane of the display panel in large area, the micro light emitting diodes may not be electrically connected to the backplane successfully due to poor alignment, which then leads to generation of defect pixels. Consequently, a manufacturing yield rate of the micro light emitting diode display panel will be reduced so that the development of the micro light emitting diode display panel is limited accordingly.

SUMMARY OF THE INVENTION

The invention is directed to methods of mass transferring electronic devices, which are capable of rapidly and accurately transferring mass electronic devices.

An embodiment of the invention provides a method of mass transferring electronic devices, which includes the following steps. First, a wafer is provided. The wafer includes a substrate and a plurality of electronic devices, and the electronic devices are arranged in a matrix on a surface of the substrate. The wafer is attached to a temporary fixing film. The wafer is cut so that the wafer is divided into a plurality of blocks. Each of the blocks includes at least a part of the electronic devices and a sub-substrate. The temporary fixing film is stretched so that the blocks on the temporary fixing film are separated from each other as the temporary fixing film is stretched. At least a part of the blocks is selected as a predetermined bonding portion, and each of the blocks in the predetermined bonding portion is transferred to a carrying substrate or a temporary substrate in sequence, so that the electronic devices in the predetermined bonding portion are bonded onto the carrying substrate. The sub-substrates of the blocks are removed in sequence.

In an embodiment of the invention, the step in which the wafer is cut so that the wafer is divided into the blocks further includes the following. A plurality of marks are formed on the wafer by using a laser scribing method, a photochemical reaction method or a photophysical reaction method. The wafer is split into the blocks along the marks by a splitting apparatus.

In an embodiment of the invention, the step in which the marks are formed on the wafer by the laser scribing method further includes the following. A laser is focused on the surface of the substrate so as to form the marks on the surface of the wafer.

In an embodiment of the invention, the step in which the marks are formed on the wafer by the laser scribing method further includes the following. A laser is focused on an internal portion of the substrate so as to form the marks on the internal portion of the wafer.

In an embodiment of the invention, a plurality of electrode pairs of the electronic devices in the predetermined bonding portion are respectively and directly bonded to a plurality of bonding electrode pairs of the carrying substrate through a thermocompression.

In an embodiment of the invention, a bonding method of the electrode pairs and the bonding electrode pairs is a eutectic bonding or a solder process.

In an embodiment of the invention, the thermocompression includes a reflow process using a solder.

In an embodiment of the invention, the step in which the sub-substrates of the blocks are removed in sequence further includes the following. The sub-substrates in the blocks are peeled off by using a laser lift-off method, a photochemical reaction method or a photophysical reaction method.

In an embodiment of the invention, after the step in which the sub-substrates in the blocks are removed, the electronic devices in the blocks expose a plurality of surfaces, and a metal is generated on the surfaces. After the metal is generated, the method further includes removing the metal.

In an embodiment of the invention, a number of the electronic devices in each of the blocks falls within a range of 1 to $5 \times 10^6$.

An embodiment of the invention provides a method of mass transferring electronic devices, which includes the following steps. A carrying substrate is provided. The carrying substrate has a plurality of bonding electrode pairs, and the bonding electrode pairs include a plurality of first bonding electrode pairs and a plurality of second bonding electrode pairs. A first wafer and a second wafer are provided. The first wafer includes a first substrate and a plurality of first electronic devices arranged in a matrix on the first substrate. The second wafer includes a second substrate and a plurality of second electronic devices arranged in a matrix on the second substrate. Positions of the first electronic devices projected on the carrying substrate are respectively a plurality of first positions. The first positions correspond to positions of the first bonding electrode pairs. Positions of the second electronic devices projected on the carrying substrate are respectively a plurality of second positions. The second positions correspond to positions of the second bonding electrode pairs. The first positions are different from the second positions. The first wafer and the second wafer are bonded to the first bonding electrode pairs and the second bonding electrode pairs on the carrying substrate in sequence, so that the first electronic devices and the second electronic devices are respectively bonded to the carrying substrate. The first substrate in the first wafer and the second substrate in the second wafer are removed.

In an embodiment of the invention, the bonding electrode pairs further include a plurality of third bonding electrode pairs. Also, the step in which the first wafer and the second wafer are provided further includes the following. A third wafer is provided. The third wafer includes a third substrate and a plurality of third electronic devices arranged in a matrix on the third substrate. Positions of the third electronic devices projected on the carrying substrate are respectively a plurality of third positions. The third positions correspond to positions of the third bonding electrode pairs. The third positions are different from the first positions and the second positions.

In an embodiment of the invention, after the step in which the first wafer and the second wafer are bonded to the first bonding electrode pairs and the second bonding electrode pairs on the carrying substrate in sequence, the method further includes the following. The third electronic devices on the third wafer are bonded to the third electrode pairs on the carrying substrate.

In an embodiment of the invention, the carrying substrate includes a positive bonding electrode and a negative bonding electrode. The positive bonding electrode has a plurality of positive electrode finger portions arranged with intervals. The negative bonding electrode has a plurality of negative electrode finger portions arranged with intervals. The positive electrode finger portions extend towards the intervals between the negative electrode finger portions. The negative electrode finger portions extend towards the intervals between the positive electrode finger portions. Each of the bonding electrode pairs is constituted by the positive electrode finger portion and the negative electrode finger portion adjacent to each other.

In an embodiment of the invention, the carrying substrate includes a glass substrate, a silicon substrate, a sapphire substrate or a substrate having an integrated circuit.

In an embodiment of the invention, the electronic devices are a plurality of micro light emitting diodes.

In an embodiment of the invention, the electronic devices are a plurality of flip-chip type or vertical type micro light emitting diodes.

In an embodiment of the invention, a diagonal length of each of the micro light emitting diodes falls within a range less than 100 μm.

Based on the above, in the methods of mass transferring electronic devices according to the embodiments of the invention, the mass electronic devices are transferred onto the carrying substrate in sequence. In this way, the methods of mass transferring electronic devices according to the embodiments of the invention may be used to rapidly and accurately transfer the mass electronic devices onto the carrying substrate. As a result, the electronic devices manufactured with the methods of mass transferring electronic devices according to the embodiments of the invention may be low in manufacturing costs and high in yield rate.

To make the above features and advantages of the disclosure more comprehensible, several embodiments accompanied with drawings are described in detail as follows.

BRIEF DESCRIPTION OF THE DRAWINGS

FIG. 2A to FIG. 6A are cross-sectional views of a wafer cut with the first method in the first embodiment of the invention.

FIG. 2B to FIG. 6B are top views of the wafer cut with the first method respectively illustrated in FIG. 2A to FIG. 6A.

FIG. 2C includes a cross-sectional view and a top view of a micro light emitting diode.

FIG. 7A and FIG. 8A are cross-sectional views of a wafer cut with the second method in the first embodiment of the invention.

FIG. 10A to FIG. 10C are cross-sectional views for illustrating three different bonding methods in the first embodiment of the invention.

FIG. 10D includes top views of FIG. 10A to FIG. 10C.

FIG. 13A to FIG. 20A are top views for illustrating steps in the second embodiment of the invention.

FIG. 13B to FIG. 20B are cross-sectional views of FIG. 13A to FIG. 20A, respectively.

DESCRIPTION OF EMBODIMENTS

Figure 1:
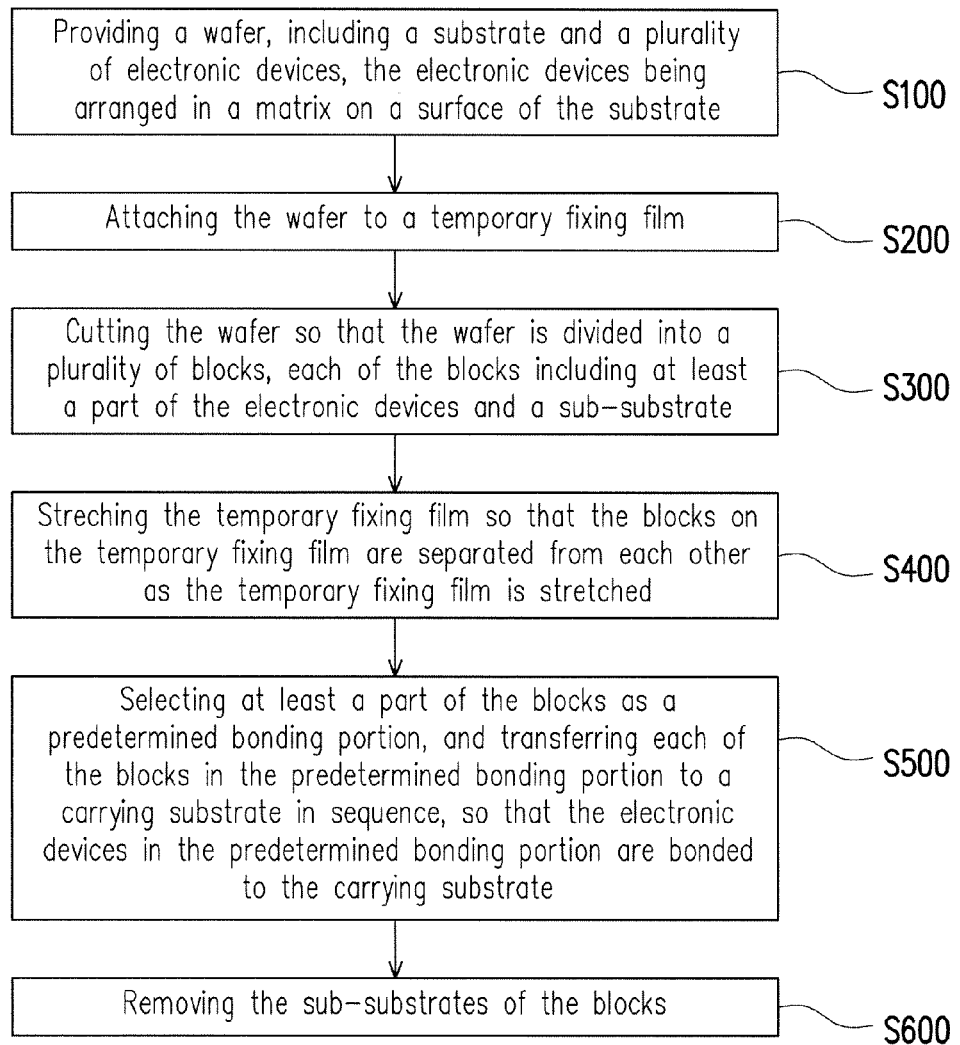
FIG. 1 is a flowchart of main steps in the first embodiment of the invention.
Figure 2A:
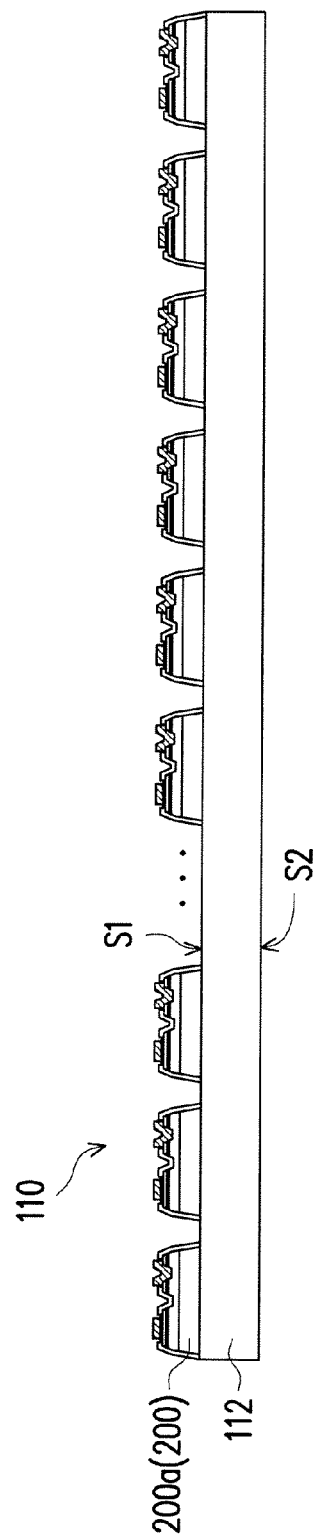
Figure 2D:
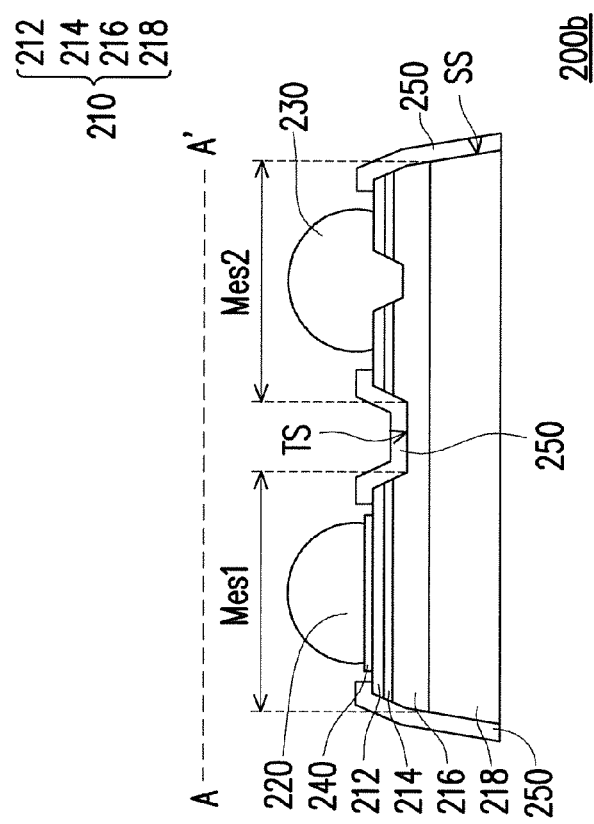
FIG. 2D to FIG. 2E are cross-sectional views of different micro light emitting diodes.
Figure 2E:
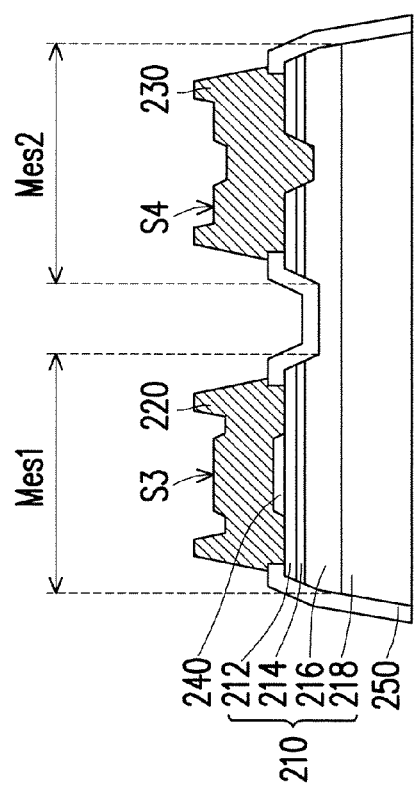
Figure 7A:
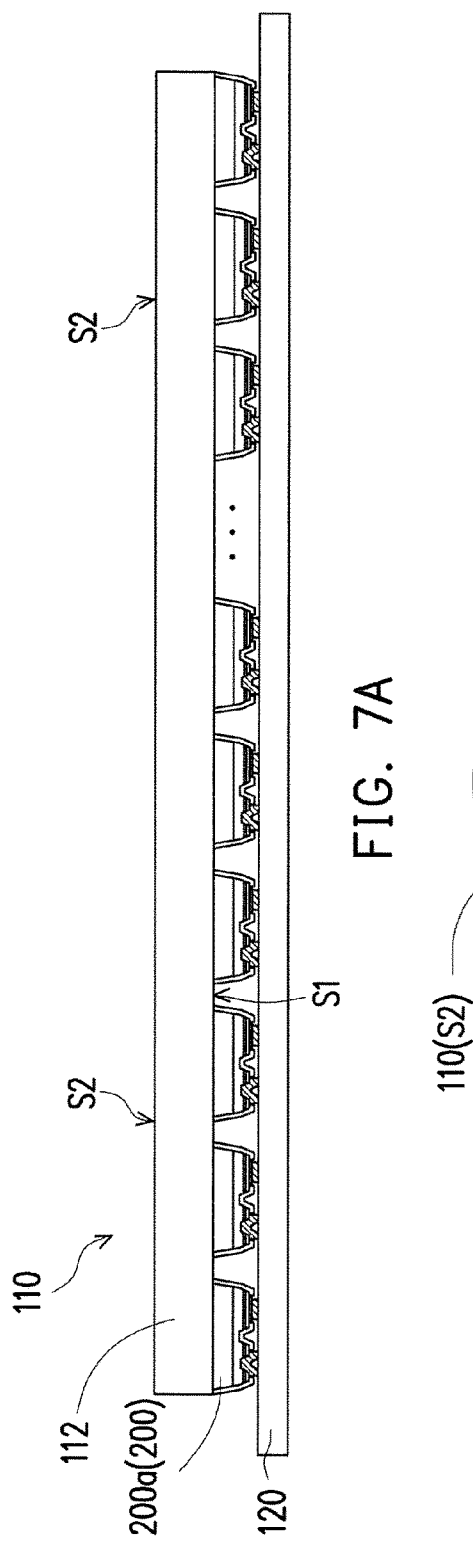
Figure 7B:
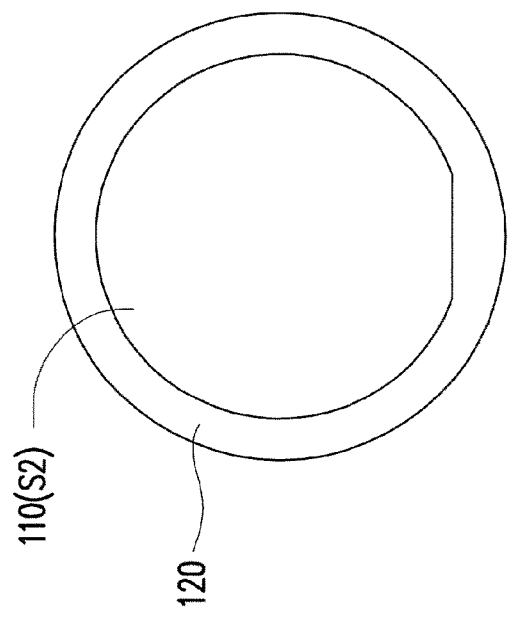
FIG. 7B and FIG. 8B are top views of the wafer cut with the second method respectively illustrated in FIG. 7A and FIG. 8A.
Figure 8B:
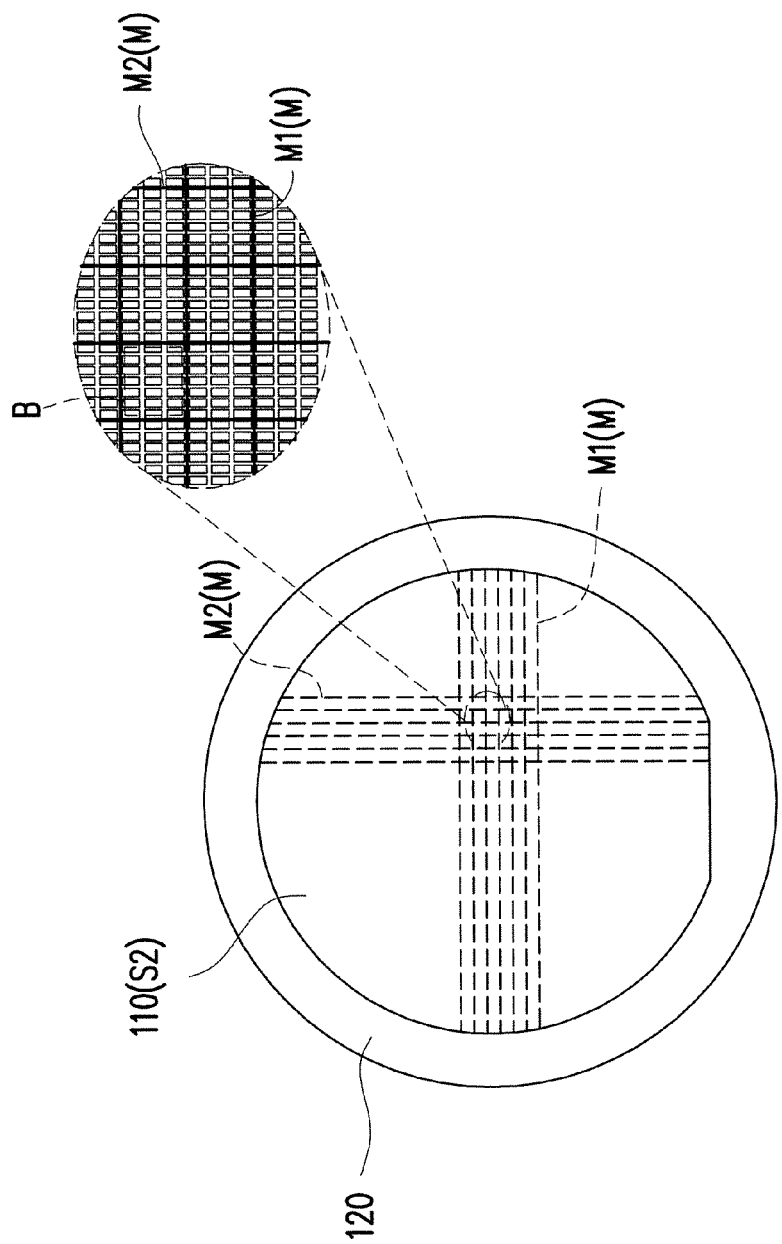
Figure 9A:
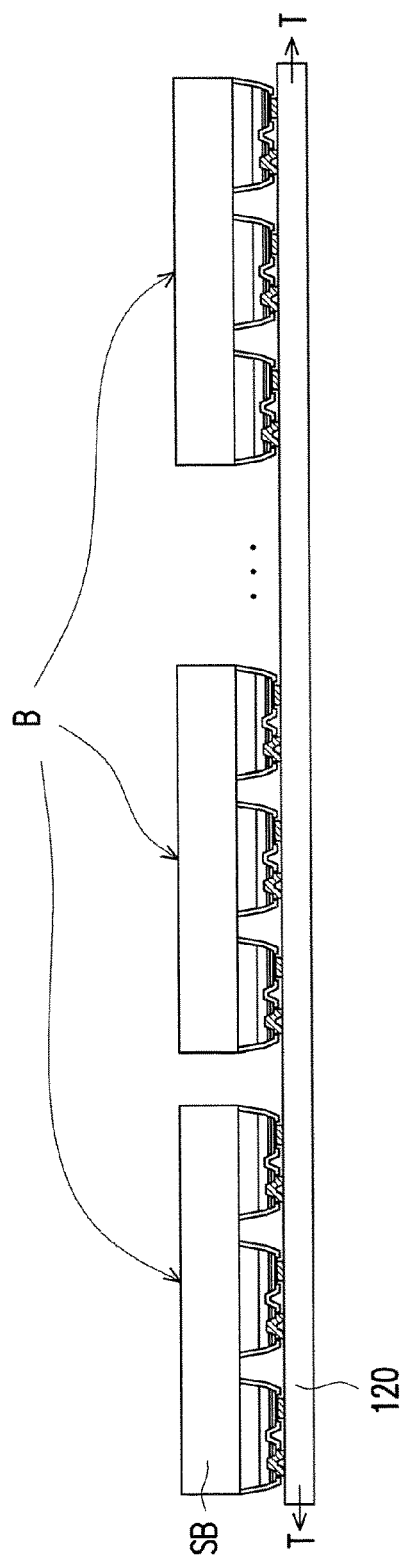
FIG. 9A and FIG. 9B are a cross-sectional view and a top view of a plurality of blocks being separated in the first embodiment of the invention, respectively.
Figure 9B:
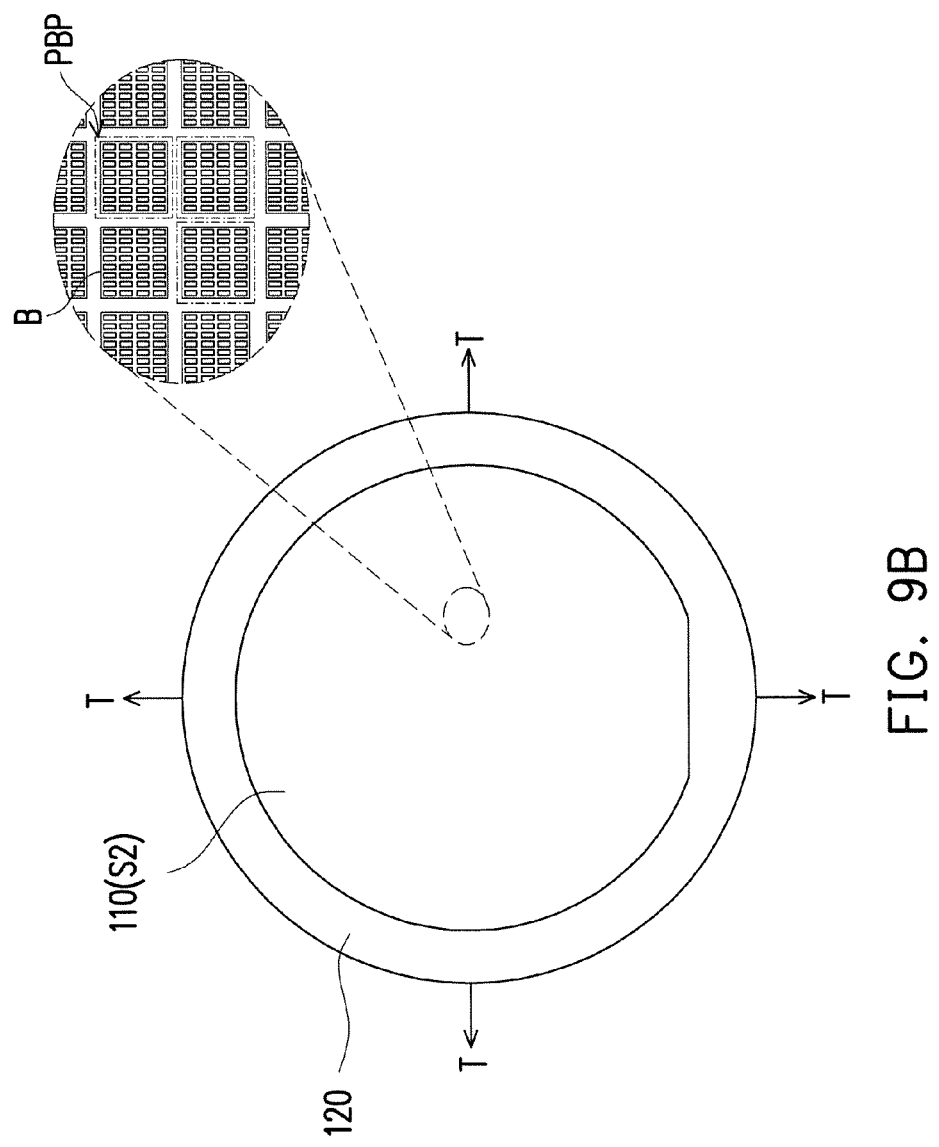
Figure 11A:
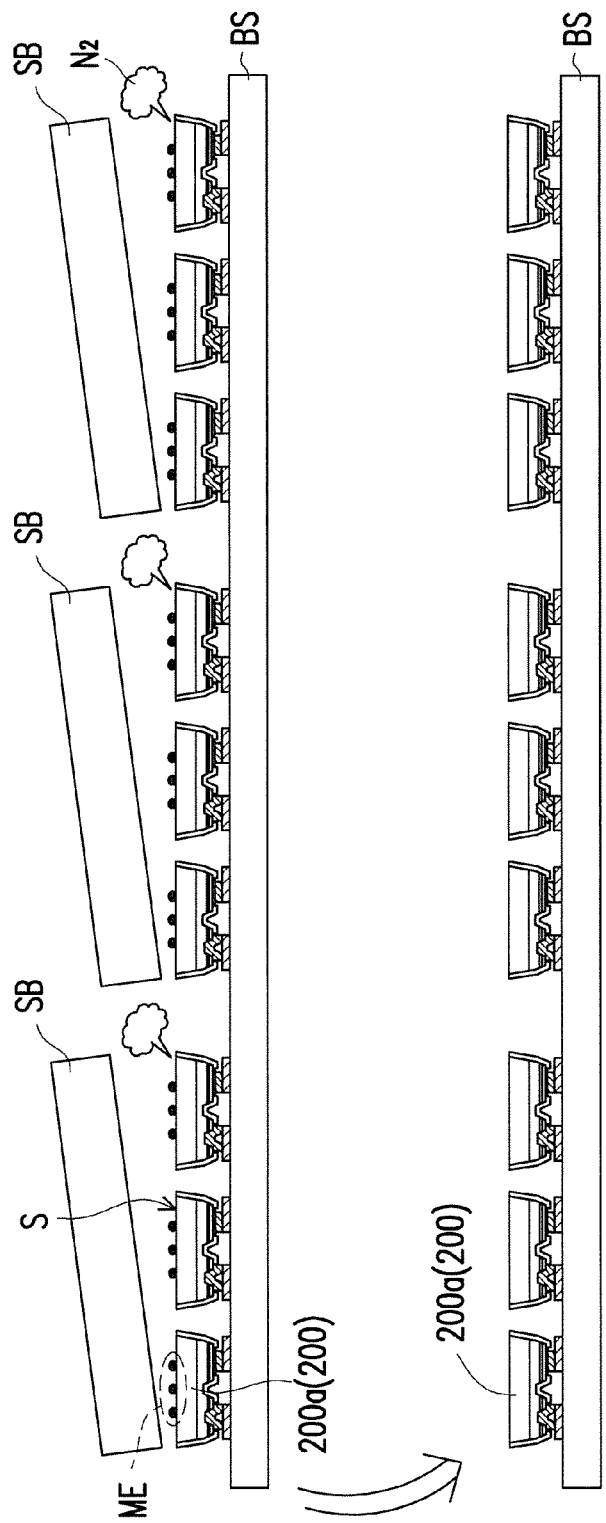
FIG. 11A and FIG. 11B are a cross-sectional view and a top view of a substrate being removed in the first embodiment of the invention, respectively.
Figure 11B:
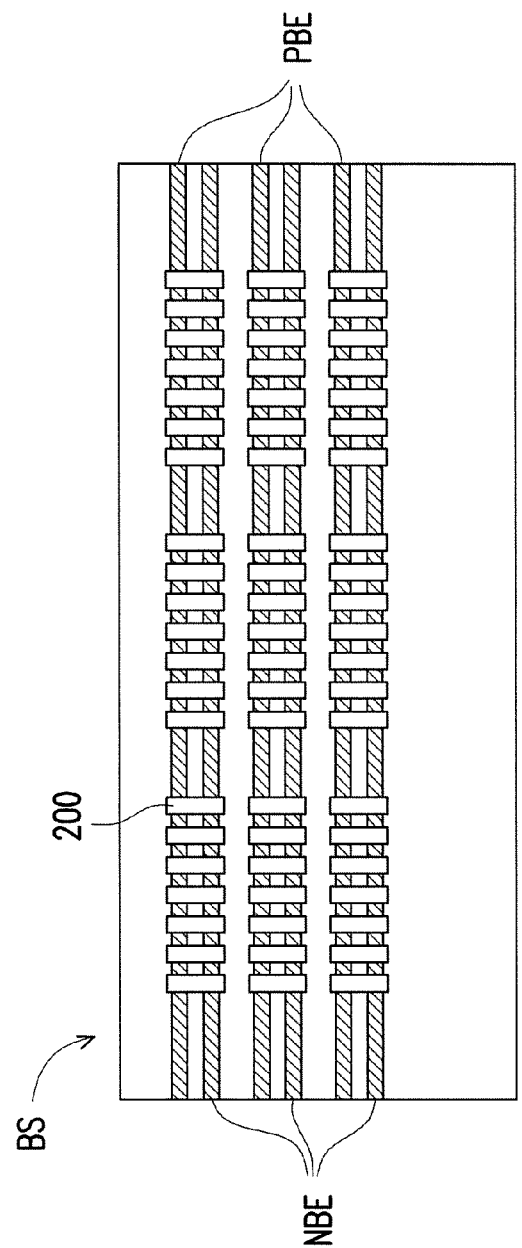

FIG. 1 is a flowchart of main steps in the first embodiment of the invention. FIG. 2A to FIG. 6A are cross-sectional views of a wafer cut with the first method in the first embodiment of the invention. FIG. 2B to FIG. 6B are top views of the wafer cut with the first method respectively illustrated in FIG. 2A to FIG. 6A. FIG. 2C includes a cross-sectional view and a top view of a micro light emitting diode. FIG. 2D to FIG. 2E are cross-sectional views of different micro light emitting diodes. FIG. 7A and FIG. 8A are cross-sectional views of a wafer cut with the second method in the first embodiment of the invention. FIG. 7B and FIG. 8B are top views of the wafer cut with the second method respectively illustrated in FIG. 7A and FIG. 8A. FIG. 9A and FIG. 9B are a cross-sectional view and a top view of a plurality of blocks being separated in the first embodiment of the invention, respectively. FIG. 10A to FIG. 10C are cross-sectional views for illustrating three different bonding methods in the first embodiment of the invention. FIG. 10D includes top views of FIG. 10A to FIG. 10C. FIG. 11A and FIG. 11B are a cross-sectional view and a top view of a substrate being removed in the first embodiment of the invention, respectively.

The first and second embodiments of the invention provide methods of mass transferring electronic devices, which involves, for example, a method of mass transferring electronic devices in wafer-level. In the first and second embodiments of the invention, the definition of the term "mass" refers to the fact that a total number of the transferred electronic devices falls within a range of $10^7$ to $5 \times 10^8$. In the following paragraphs, the methods of mass transferring electronic devices of the first and second embodiments of the invention will be described in details.

Referring to FIG. 1, FIG. 2A and FIG. 2B together, in step S100, a wafer 110 is provided. In the present embodiment, a size of the wafer 110 is, for example, 2 inch or 4 inch, but the invention is not intend to limit the size of the wafer 110. The wafer 110 includes a substrate 112 and a plurality of electronic devices 200. The substrate 112 has a first surface S1 and a second surface S2 opposite to each other. The substrate 112 is, for example, a sapphire substrate, a gallium nitride substrate, an aluminum nitride substrate, a silicon substrate, a gallium arsenide substrate and a silicon carbide substrate, but the invention is not intend to limit the type of the substrate. In the present embodiment, the substrate 112 is, for example, a growth substrate for manufacturing the electronic devices 200. Specifically, the substrate 112 is embodied as the sapphire substrate herein. The electronic devices 200 are arranged in a matrix on the first surface S1 of the substrate 112. Each of the electronic devices 200 is a light emitting element, which is a micro electronic light emitting element, for example. In particular, a diagonal length W of each of the electronic devices 200 is, for example, a size in micron-level, and the diagonal length W of each of the electronic devices 200 falls within a range of 1 µm to 100 µm. Here, most preferably, the diagonal length W of each of the electronic devices 200 falls within a range of 10 µm to 50 µm. In the present embodiment, the electronic devices 200 are embodied as micro light emitting diodes 200a, which are flip-chip type micro light emitting diodes. In other words, the wafer 110 of the preset embodiment is a light emitting diode wafer (LED wafer), and more particularly, a micro light emitting diode wafer (micro LED wafer). Nonetheless, in other embodiments, the type of the electronic devices 200 may also be micro electronic devices of other types, such as vertical type micros electronic devices or micro electronic devices having electrodes with two different polarities disposed on different sides, which are not limited by the invention.

With reference to FIG. 2C, in the present embodiment, the micro light emitting diode 200a includes an epitaxial stack layer 210, a first electrode 220, a second electrode 230, a current spreading layer 240 and a protection layer 250. The epitaxial stack layer 210 includes a P-type doped semiconductor layer 212, a light emitting layer 214, an N-type doped semiconductor layer 216 and an unintentionally doped semiconductor layer 218. The unintentionally doped semiconductor layer 218 may serve as a low temperature nucleation layer or a buffer layer. When serving as the low temperature nucleation layer, a major constituent of the unintentionally doped semiconductor layer 218 is GaN. When serving as the low temperature nucleation layer, the major constituent of the unintentionally doped semiconductor layer 218 is AlN or a buffer layer formed during a non epitaxial grown process, such as GaN, AlN, SiC or a combination containing a carbon material or carbon covalent bond, for example. The light emitting layer 214 is located between the P-type doped semiconductor layer 212 and the N-type doped semiconductor layer 216. The unintentionally doped semiconductor layer 218 is located between the N-type doped semiconductor layer 216 and the substrate 112. The micro light emitting diode 200a of the present embodiment is a GaN-based light emitting diode, for example. To be specific, the P-type doped semiconductor layer 212 is, for example, a P-type GaN layer (p-GaN). The light emitting layer 214 is also known as an active layer, and a structure thereof is, for example, a multiple quantum well (MQW) formed by alternately stacking multiple InGaN layers and multiple GaN layers (InGaN/GaN). The N-type doped semiconductor layer 216 is, for example, an N-type GaN layer (GaN). The unintentionally doped semiconductor layer 218 is, for example, an unintentionally doped GaN layer (u-GaN). The epitaxial stack layer 210 has a first platform portion Mes1 and a second platform portion Mes2. The first platform portion Mes1 and the second platform portion Mes2 are connected to each other through the second type doped semiconductor layer 216. The first electrode 220 is disposed on the first platform portion Mes1. The second electrode 230 is disposed on the second platform portion Mes2. The current spreading layer 240 is located between the first electrode 220 and the P-type doped semiconductor layer 212 of the epitaxial stack layer 210, and the first electrode 220 is electrically connected to the epitaxial stack layer 210 through the current spreading layer 240. The current spreading layer 240 is, for example, a transparent conductive layer, and a material of the current spreading layer 240 is, for example, a transparent conductive material such as indium tin oxide (ITO), an indium zinc oxide (IZO) or a transparent metal layer, or a metal material with reflection function such as Au, Ni, Pt, Sn, Al, Ti, Al/Cu alloy, Sn/Ag/Cu alloy, Sn alloy or an alloy of the above. However, the invention is not limited to the above. The second electrode 230 is electrically connected to the epitaxial stack layer 210. The protection layer 250 covers a side surface SS of the epitaxial stack layer 210 and a part of a top surface TS of the epitaxial stack layer 210. A material of the protection layer 250 is, for example, a silicon dioxide ($SiO_2$) or a silicon nitride ($Si_3N_4$) or a stack combination of two materials with different refractive indexes which can provide protection or reflection functions. However, the invention is not limited to the above. Materials of the first electrode 220 and the second electrode 230 are, for example, a metal, but the invention is not limited thereto.

With reference to FIG. 2D and FIG. 2E, FIG. 2D and FIG. 2E respectively show different implementations of the micro light emitting diode. A micro light emitting diode 200b of FIG. 2D is approximately similar to the micro light emitting diode 200a of FIG. 2C, a major difference between the two is that, shapes of the first electrode 220 and the second electrode 230 are, for example, ball-like shapes. A micro light emitting diode 200c of FIG. 2E is approximately similar to the micro light emitting diode 200a of FIG. 2C, a major difference between the two is that, the first electrode 220 covers the current spreading layer 240. In other words, the current spreading layer 240 is located within a projection region where the first electrode 220 is projected on the epitaxial stack layer 210. A surface S3 of the first electrode 220 exposed to the outside has different level heights, and a surface S4 of the second electrode 230 to the outside has different level heights. At least a portion of the surface S3 and at least a portion of the surface S4 are at the same level.

Figure 3A:
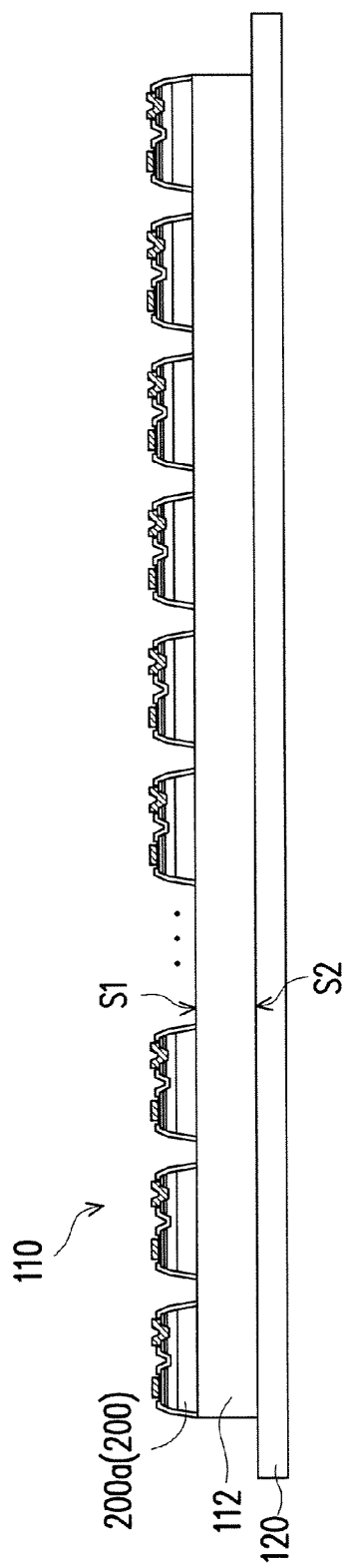
Figure 3B:
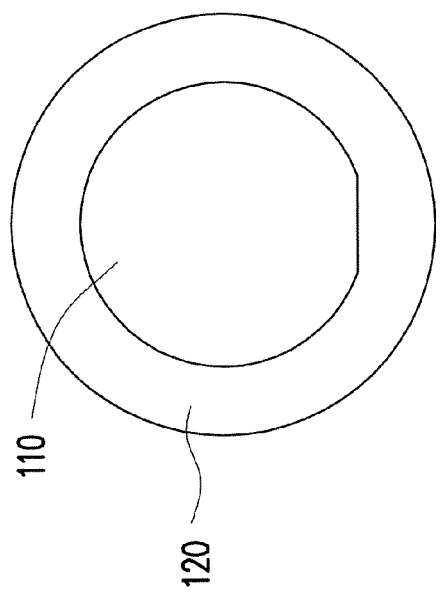

Referring to FIG. 1, FIG. 3A and FIG. 3B together, in step S200, the wafer 110 is attached to a temporary fixing film 120. In detail, the second surface S2 of the wafer 110 (which is disposed without the micro light emitting diodes 200a) is attached to the temporary fixing film 120 so that the micro light emitting diodes 200a may be exposed to the outside. In the present embodiment, the temporary fixing film 120 is, for example, a blue tape, a white tape or a transparent film (UV film), and the temporary fixing film 120 itself is adhesive so that the wafer 110 may be attached onto the temporary fixing film 120.

Figure 4A:
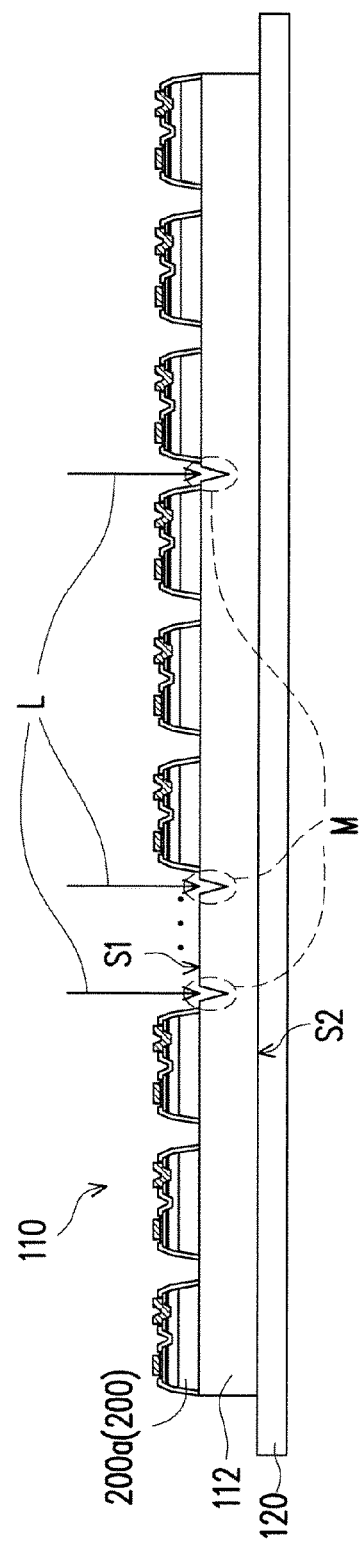

Referring to FIG. 1, FIG. 4A and FIG. 4B together, in step S300, the wafer 110 is cut so that the wafer 110 is divided into a plurality of blocks B. Each of the blocks includes at least a part of the micro light emitting diodes 200a and a sub-substrate SB. In particular, step S300 further includes: forming a plurality of pre-cut marks M on the wafer 110, the epitaxial stack layer 210 or the substrate 112 by using a laser scribing method, a photochemical reaction method or a photophysical reaction method. With reference to FIG. 4, specifically, a laser L is focused on the first surface S1 of the substrate 112 by using a laser source (not shown), so as to form the marks M on the first surface S1 of the substrate 112. In other words, the first process for scribing the wafer 110 is, for example, a laser scribing process on the surface. With reference to FIG. 4B, a part of marks M1 among the marks M extends along a first direction D1 on the wafer 110, and another part of marks M2 among the marks M extends along a second direction D2 perpendicular to the first direction D1 on the wafer 110. A width of the block B in the second direction D2 is defined by two adjacent marks M1. A width of the block B in the first direction D1 is defined by two adjacent marks M2. A predetermined size of the block B is constituted by the two adjacent marks M1 and the two adjacent marks M2, and a shape of the block B is approximately a rectangle or a square. However, the invention is not limited thereto.

Figure 5A:
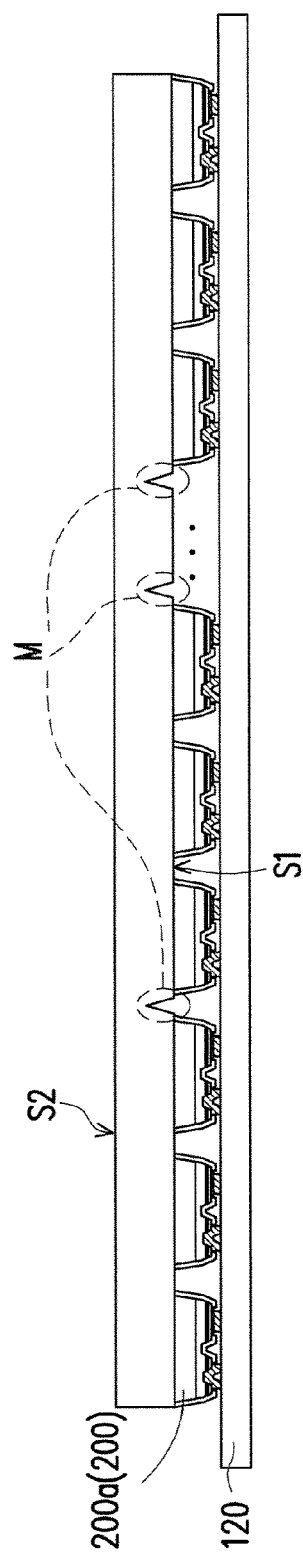
Figure 5B:
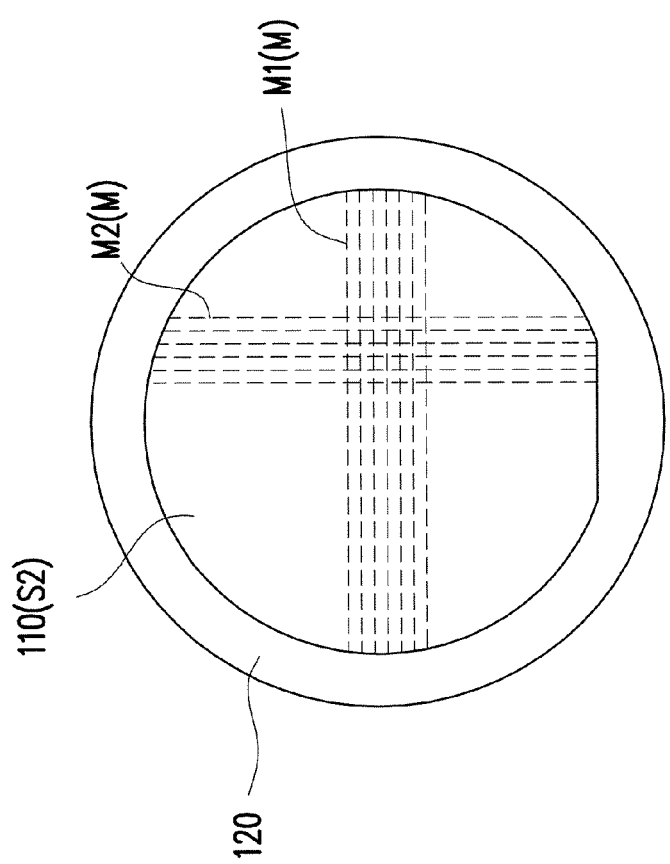

With reference to FIG. 5A and FIG. 5B, the scribed (pre-cut) wafer 110 is flipped over onto the temporary fixing film 120 so that the first surface S1 (which is disposed with the micro light emitting diodes 200a) of the substrate 112 faces the temporary fixing film 120 while the second surface S2 of the substrate 112 is exposed to the outside.

Figure 6B:
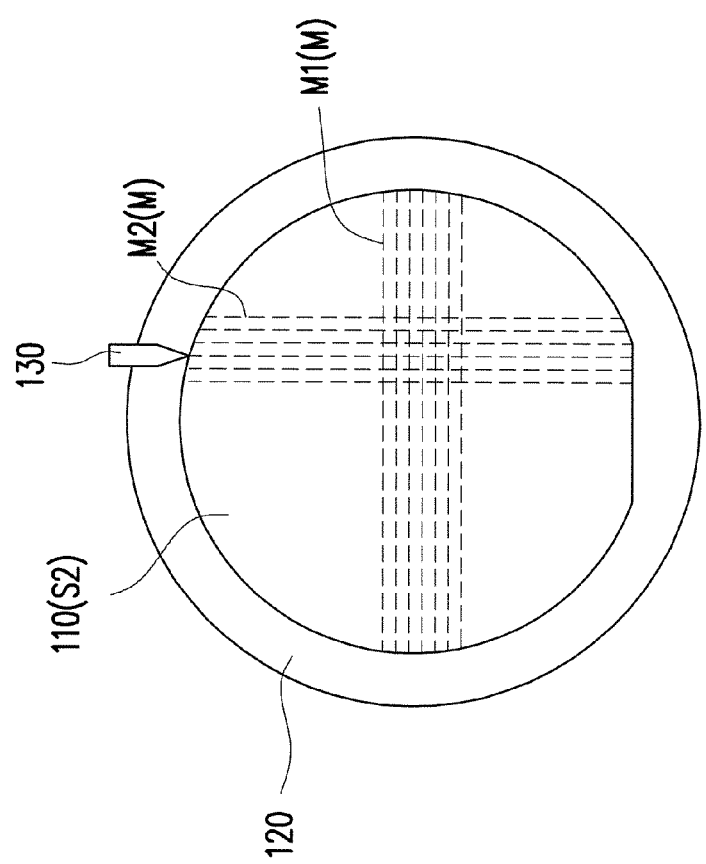

With reference to FIG. 6A and FIG. 6B, by applying an instantaneous force to the second surface S2 of the substrate 112 along the marks M with use of a splitting apparatus 130, the wafer 110 may be split into the blocks B on the temporary fixed layer 120. The splitting apparatus 130 is embodied as a chopper herein. The block B formed after splitting the wafer 110 may be regarded as one electronic device unit (e.g., one micro light emitting diode unit) including multiple electronic devices 200, such as the micro light emitting diode, for example. In the present embodiment, the number of the micro light emitting diodes 200a included by each of the blocks B falls within, for example, a range of 1 to $5 \times 10^6$, but the invention is not limited thereto. At this point, description regarding the first method for cutting the wafer 110 according to the first embodiment of the invention is substantially complete.

The second method for cutting the wafer in the first embodiment of the invention is approximately similar to the first method for cutting the wafer. The differences between the second method for cutting the wafer and the first method for cutting the wafer will be discussed in the following paragraphs.

Continuing from step S100 of FIG. 1, FIG. 2A and FIG. 2B with reference to FIG. 1, FIG. 7A and FIG. 7B, in step S200, the wafer 110 is attached to the temporary fixing film 120. In detail, the first surface S1 of the wafer 110 (which is disposed with the micro light emitting diodes 200a) is attached to the temporary fixing film 120 so that the second surface S2 faces to the outside.

With reference to FIG. 1, FIG. 8A and FIG. 8B, in step S300, the wafer 110 is cut so that the wafer 110 is divided into a plurality of blocks B. Each of the blocks B includes at least a part of the micro light emitting diodes 200a and a sub-substrate SB. In the present embodiment, a plurality of pre-cut marks M are formed on the wafer 110 by using a laser scribing method, a photochemical reaction method or a photophysical reaction method. A difference from the method for forming the marks M of FIG. 4A and FIG. 4B is that, herein, a laser L is focused on an internal portion of the substrate 112 by using a laser source so as to form the marks M on the internal portion of the substrate 112. In other words, the second process for cutting the wafer 110 comprises, for example, a stealth laser scribing process. With reference to FIG. 8B, the method for forming the marks on the wafer 110 and the shape of the block B in FIG. 8B are similar to those in FIG. 4B, which are not repeated hereinafter.

Continuing from step of FIG. 8A and FIG. 8B, the wafer 110 is split into the blocks B on the temporary fixing film 120 by using step of FIG. 6A and FIG. 6B. At this point, description regarding the second method for cutting the wafer 110 according to the first embodiment of the invention is substantially complete.

After the wafer 110 is divided into the blocks B on the temporary fixing film 120 by using the first method for cutting the wafer 110 or the second method for cutting the wafer 110, with reference to FIG. 1, FIG. 9A and FIG. 9B, in step S400, the temporary fixing film 120 is stretched so that the blocks B on the temporary fixing film 120 are separated from each other as the temporary fixing film 120 is stretched. The method for stretching the temporary fixing film 120 is to apply a tension T by a film stretcher (not shown) so that the temporary fixing film 120 is stretched and extended outwardly, for example. Through this stretching step, the adjacent blocks B may be separated so each two adjacent blocks are spaced by a specific distance for the subsequent step of removing each of the blocks B from the temporary fixing film 120 one by one.

After the stretching step is performed, the next step is to bond the selected blocks B to a carrying substrate BS. There are three major methods for bonding the blocks B to the carrying substrate BS. The first bonding method is introduced as follows.

With reference to FIG. 1, FIG. 9B, FIG. 10A and FIG. 10D, in step 500, at least a part of the blocks B is selected as a predetermined bonding portion PBP (as shown in FIG. 9B), and each of the blocks B in the predetermined bonding portion PBP is transferred to the carrying substrate BS in sequence. In other words, the block B may be regarded as a transferring platform for transferring the micro light emitting diodes 200a. The carrying substrate BS may be referred to as a sub-mount. In the present embodiment, the number of the blocks B in the predetermined bonding portion PBP is, for example, three. In other embodiments, the predetermined bonding portion PBP may also includes all the blocks B formed after cutting the wafer 110, and the invention is not limited thereto. In the present embodiment, the carrying substrate BS is, for example, a substrate having an integrated circuit configured to, for example, serve as the backplane of the display panel. The carrying substrate BS includes a plurality of bonding electrodes BE. A part of the bonding electrodes BE among the bonding electrodes BE belongs to a positive bonding electrode PBE, and another part of the bonding electrodes BE among the bonding electrodes BE belongs to a negative bonding electrode PBE. The positive bonding electrodes PBE and the negative bonding electrodes NBE are alternately arranged on the carrying substrate BS. A bonding electrode pair BEP is constituted by the positive bonding electrode PBE and the negative bonding electrode NBE adjacent to each other. In other embodiments, the carrying substrate BS may also be a glass substrate, a silicon substrate, a sapphire substrate, a CMOS (Complementary Metal-Oxide-Semiconductor) circuit substrate, a TFT (Thin Film Transistor) substrate or substrates of other types. The form of the carrying substrate BS and a corresponding circuit structure of the carrying substrate BS may be adjusted based on different usage requirements, design specifications and product positioning. In particular, the corresponding circuit structure of the carrying substrate BS and the bonding electrode pairs BEP of the carrying substrate BS respectively in contact with the electrode pairs (one electrode pair is constituted by the two electrodes 210 and 220) of the micro light emitting diodes 200a of each of the blocks B may be adjusted based on different usage requirements, design specifications and product positioning.

However, the invention is not limited thereto. In the present embodiment, step S500 further includes the following steps. First, a suction apparatus is provided. Specifically, the suction apparatus is embodied as a suction nozzle herein. Next, the second surfaces S2 of the sub-substrate SB of each of the blocks B in the predetermined bonding portion PBP are sucked up by the suction apparatus, and each of the blocks B in the predetermined bonding portion PBP is then transferred to the bonding electrode pairs BEP of the carrying substrate BS in sequence. Next, a pressure P is applied to each of the boards B in the predetermined bonding portion PBP, so that a plurality of electrode pairs (one electrode pair is constituted by the two electrodes 210 and 220) of the micro light emitting diodes 200a of each of the blocks B are respectively in contact with the bonding electrode pairs BEP of the carrying substrate BS. Afterwards, a pressurizing process, a heating process or a combined process of the two above is performed on the electrode pairs and the bonding electrode pairs BEP, so that the electrode pairs of the micro light emitting diodes 200a of each of the blocks B in the predetermined bonding portion PBP are respectively bonded to the bonding electrode pairs BEP of the carrying substrate BS. In the present embodiment, the electrode pairs of the micro light emitting diodes 200a and the bonding electrode pairs BEP of the carrying substrate BS are bonded by a eutectic bonding (or a solder process in other embodiments, for example). In the present embodiment, the material of the electrode pairs (the two electrodes 210 and 220) of the micro light emitting diode 200a is Sn/Ag/Cu alloy or an alloy containing Sn, which is bonded directly to the bonding electrode pairs BEP of the carrying substrate BS. Because the bonding electrode pairs BEP on the carrying substrate BS and the two electrodes 210 and 220 of the micro light emitting diodes 200a will be pulled closer to each other and eventually bonded due to cohesive force, a self-aligned effect may be achieved. Here, a temperature of the heating process falls within a range of 150° C. to 330° C., for example. More preferably, the temperature of the heating process falls within a range of 220° C. to 320° C., for example.

The second bonding method is introduced as follows. With reference to FIG. 1, FIG. 9B, FIG. 10B and FIG. 10D, in step S500, at least a part of the blocks B is selected as a predetermined bonding portion PBP, and each of the blocks B in the predetermined bonding portion PBP is transferred to the carrying substrate BS in sequence. In detail, step S500 further includes the following. First, a solder F is coated onto the carrying substrate BS, and the solder F is, for example, a material containing Sn element. Next, the second surfaces S2 of the sub-substrate SB of each of the blocks B in the predetermined bonding portion PBP are sucked up by a suction apparatus (not shown), and the electrode pairs of the micro light emitting diodes 200a of each of the blocks B in the predetermined bonding portion PBP are respectively aligned with the bonding electrode pairs BEP of the carrying substrate BS. Afterwards, a reflow process or a heating process is performed on the electrode pairs of the micro light emitting diodes 200a of each of the blocks B in the predetermined bonding portion PBP, the bonding electrode pairs BEP and the solder F, so that the electrode pairs of the micro light emitting diodes 200a of each of the blocks B in the predetermined bonding portion PBP are bonded to the bonding electrode pairs BEP of the carrying substrate BS. Here, a temperature of the reflow process falls within a range of 150° C. to 330° C., for example. More preferably, the temperature of the heating process falls within a range of 220° C. to 320° C., for example. It is noted that, during the process of aligning the electrode pairs of the micro light emitting diodes 200a to the bonding electrode pairs BEP, the effect of alignment may not be perfectly achieved for sure. In the present embodiment, with disposition of the solder F, the predetermined bonding portion PBP may be temporarily adhered to the carrying substrate BS. Next, in the reflow process, at least a part of the solder F is volatilized due to increasing temperature. Because the bonding electrode pairs BEP on the carrying substrate BS and the electrode pairs of the micro light emitting diodes 200a will be pulled closer to each other and eventually bonded due to cohesive force, a self-aligned effect may be achieved.

The third bonding method is introduced as follows. With reference to FIG. 1, FIG. 9B, FIG. 10C and FIG. 10D, in step S500, at least a part of the blocks B is selected as a predetermined bonding portion PBP, and each of the blocks B in the predetermined bonding portion PBP is transferred to the carrying substrate BS in sequence. In detail, step S500 further includes the following. First, an anisotropic conductive film (ACF) 140 is formed on the carrying substrate BS. The anisotropic conductive film 140 includes an insulation paste material 142 and a plurality of conductive particles C. The insulation paste material 142 encapsulates the conductive particles C. A particle size of each of the conductive particles C is less than or equal to any one electrode among the two electrodes 210 and 220 of each of the micro light emitting diode 200a, or less than or equal to the bonding electrode BE of the carrying substrate BS. Next, the second surfaces S2 of the sub-substrate SB of each of the blocks B in the predetermined bonding portion PBP are sucked up by a suction apparatus (not shown), and the electrode pairs of the micro light emitting diodes 200a of each of the blocks B in the predetermined bonding portion PBP are respectively aligned with the bonding electrode pairs BEP of the carrying substrate BS. Next, a pressure is applied to each of the boards B in the predetermined bonding portion PBP, so that the electrode pairs of the micro light emitting diodes 200a of each of the blocks B in the predetermined bonding portion PBP are bonded to the bonding electrode pairs BEP of the carrying substrate BS through the anisotropic conductive film 140. Afterwards, a pressurizing process, a heating process or a combined process of the two is performed on the electrode pairs of the micro light emitting diodes 200a of each of the blocks B in the predetermined bonding portion PBP, the bonding electrode pairs BEP of the carrying substrate BS and the anisotropic conductive film 140. Here, a temperature of the heating process falls within a range of 150° C. to 260° C., for example. It is noted that, a conductive effect in vertical direction can be achieved through the anisotropic conductive film 140 according to the present embodiment.

According to the above description, after each of the blocks B in the predetermined bonding portion PBP is bonded to the carrying substrate BS by any one of the three bonding methods introduced above, with reference to FIG. 1, FIG. 11A and FIG. 11B, in step S600, the sub-substrates SB of the blocks B are removed (e.g., the sub-substrates SB of the blocks B in the predetermined bonding portion PBP are removed). In the present embodiment, a method for removing the sub-substrates SB is, for example, removing the sub-substrates SB by using a laser lift-off method, a photochemical reaction method or a photophysical reaction method. A selected laser source may, for example, emit a KrF excimer laser with wavelength of 248 nm, emit a DPSS (Diode-pumped Solid-State) laser with wavelength of 266 nm, or emit a DPSS laser with wavelength of 355 mm. However, the invention is not limited thereto. After step S600, the micro light emitting diodes 200a of the blocks B in the predetermined bonding portion PBP expose a plurality of surfaces S. It should be noted that, because a laser energy is relatively high, semiconductor layers in the micro light emitting diodes 200a will conduct a reduction reaction after receiving the laser. Specifically, in the present embodiment, the unintentionally doped GaN semiconductor layers of the micro light emitting diodes 200a expose the surfaces S because of the laser lift-off method performed on the sub-substrates SB. After GaN is reacted to the laser, a metal Me (i.e., Ga) and nitrogen ($N_2$) are generated on the surfaces S, whereas nitrogen is scattered to the atmosphere. Therefore, a process of removing the metal Me is required after step S600. For example, the surfaces S exposed by the micro light emitting diodes 200a may be soaked in an acid solution so that the metal Me generated on the surfaces S may be dissolved by the reaction with the acid solution. Alternatively, the generated metal Me (i.e., Ga) may be removed by a gas chemical reaction. In the present embodiment, the acid solution is, for example, a hydrochloric acid (HCL) solution. In other embodiments, use of different acid solutions may be selected based on different generated metals, and the invention is not limited thereto. At this point, the method of mass transferring electronic devices in the first embodiment of the invention is substantially complete.

It should be noted, in the foregoing embodiments, step S600 (in which the sub-substrates SB of the blocks B are removed) is performed after step S500. In another embodiment, step S600 may also be performed after step S400. In other words, in this embodiment, while the blocks B are on the temporary fixing film 120, the sub-substrates SB in the blocks B may be removed in sequence so that the micro light emitting diodes 200a on each of the blocks B are electrically separated from each other. Subsequently, the micro light emitting diodes 200a are sucked up or adhered through a sucker or an adhesive apparatus (not shown) so that the step of selecting at least a part of the blocks, in sequence or all at once, as the predetermined bonding portion to be transferred and bonded to the carrying substrate BS may be achieved. A priority of the step for removing the substrate may be decided according to actual requirements, and the invention is not limited thereto.

In the foregoing embodiment, step S600 (in which the sub-substrates SB of the blocks B are removed) is performed after step S500. In another embodiment, step S600 may also be performed after step S200. In other words, in this embodiment, while the blocks B are on the temporary fixing film 120, the sub-substrates SB in the blocks B may be removed in sequence so that the micro light emitting diodes on each of the blocks B are electrically separated from the sub-substrates SB in sequence or all at once. Subsequently, the micro light emitting diodes 200a are sucked up or adhered through a sucker or an adhesive apparatus (not shown) so that the step of selecting at least a part of the blocks, in sequence or all at once, as the predetermined bonding portion to be transferred and bonded to the carrying substrate BS may be achieved. A priority of the step for removing the substrate may be decided according to actual requirements, and the invention is not limited thereto.

In the method of mass transferring electronic devices according to the first embodiment of the invention, the wafer 110 having the mass electronic devices 200 is cut into the blocks B having the quantity less than that of the electronic devices 200. Next, the electronic devices 200 in the predetermined bonding portion PBP selected from the blocks B are transferred and bonded to the carrying substrate BS in sequence or all at once. In this way, the electronic devices 200 may be transferred onto the carrying substrate BS rapidly and more accurately without using the time-consuming transferring method mentioned in Description of Related Art—in which all the micro light emitting diodes are individually picked up and aligned on the backplane of the display panel, or the transferring method with inaccurate alignment also mentioned in Description of Related Art—in which all the micro light emitting diodes are directly transferred onto the backplane in large area. Accordingly, the electronic devices (e.g., the micro light emitting diode display panel) manufactured with the method of mass transferring electronic devices in the first embodiment of the invention may be low in manufacturing costs and high in yield rate.

Figure 12:
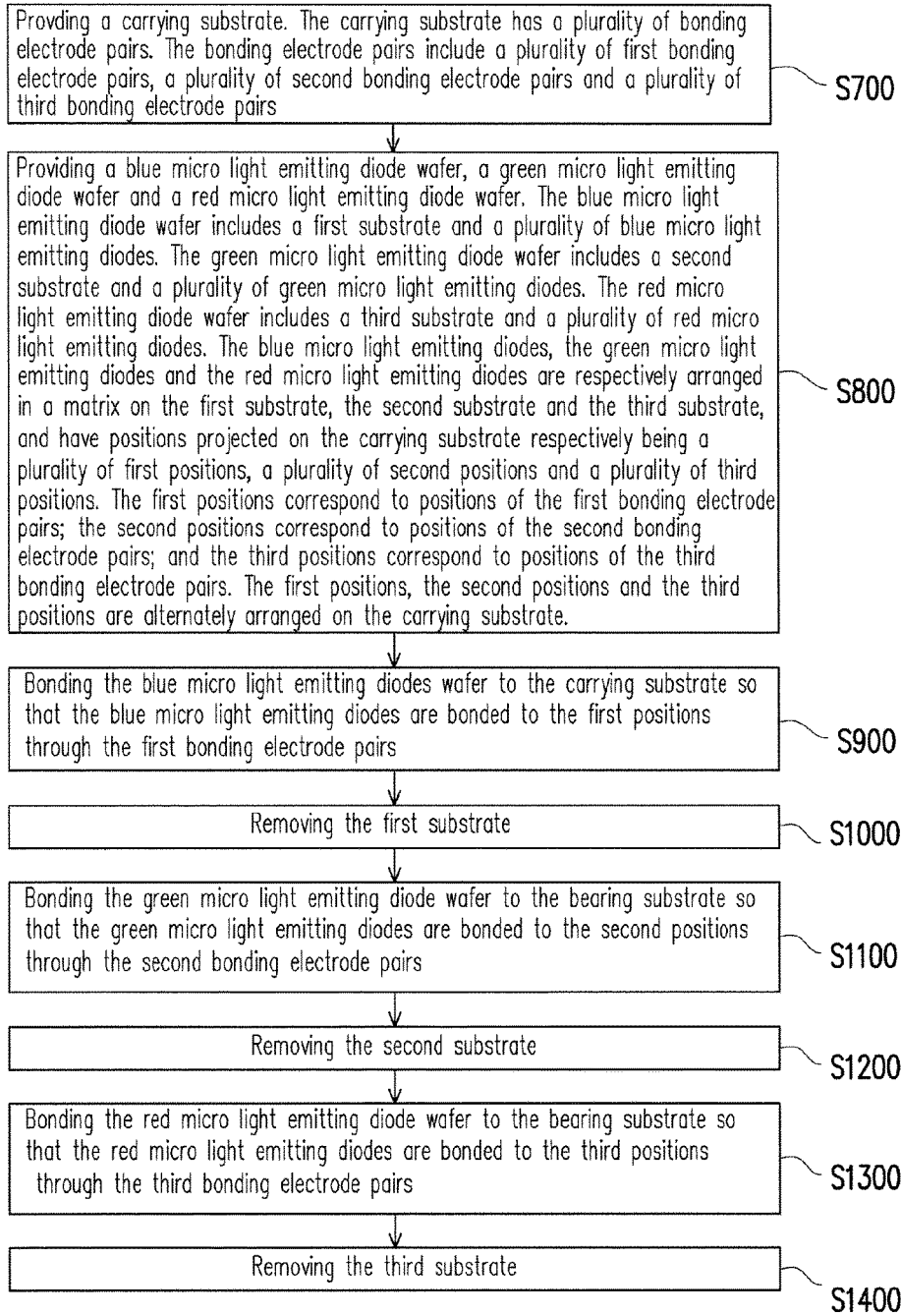
FIG. 12 is a flowchart of a method of mass transferring electronic devices in the second embodiment of the invention.

FIG. 12 is a flowchart of a method of mass transferring electronic devices in the second embodiment of the invention. FIG. 13A to FIG. 20A are top views for illustrating the second embodiment of the invention. FIG. 13B to FIG. 20B are cross-sectional views of FIG. 13A to FIG. 20A, respectively.

Figure 13A:
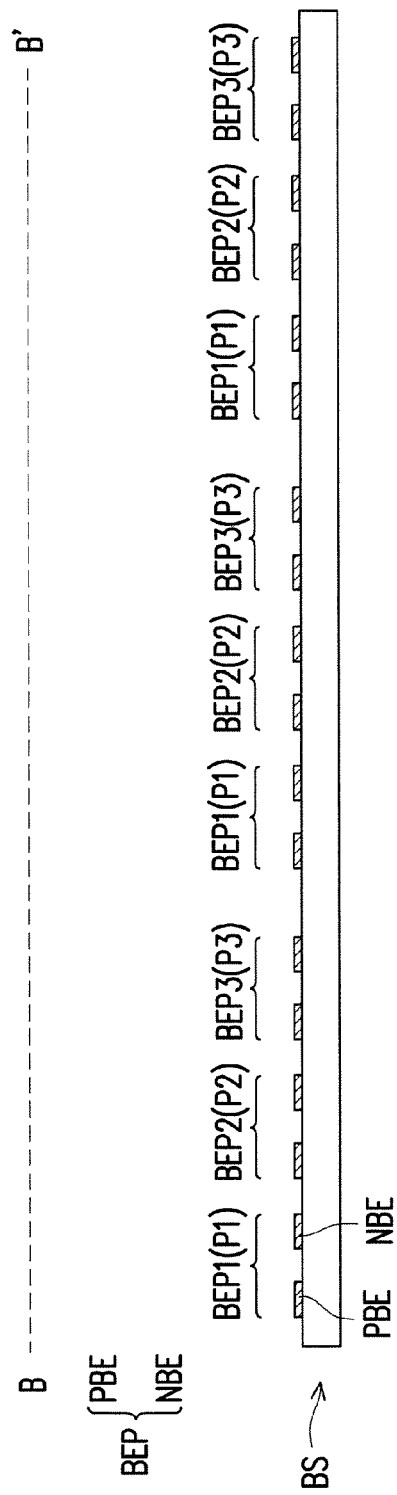
Figure 13B:
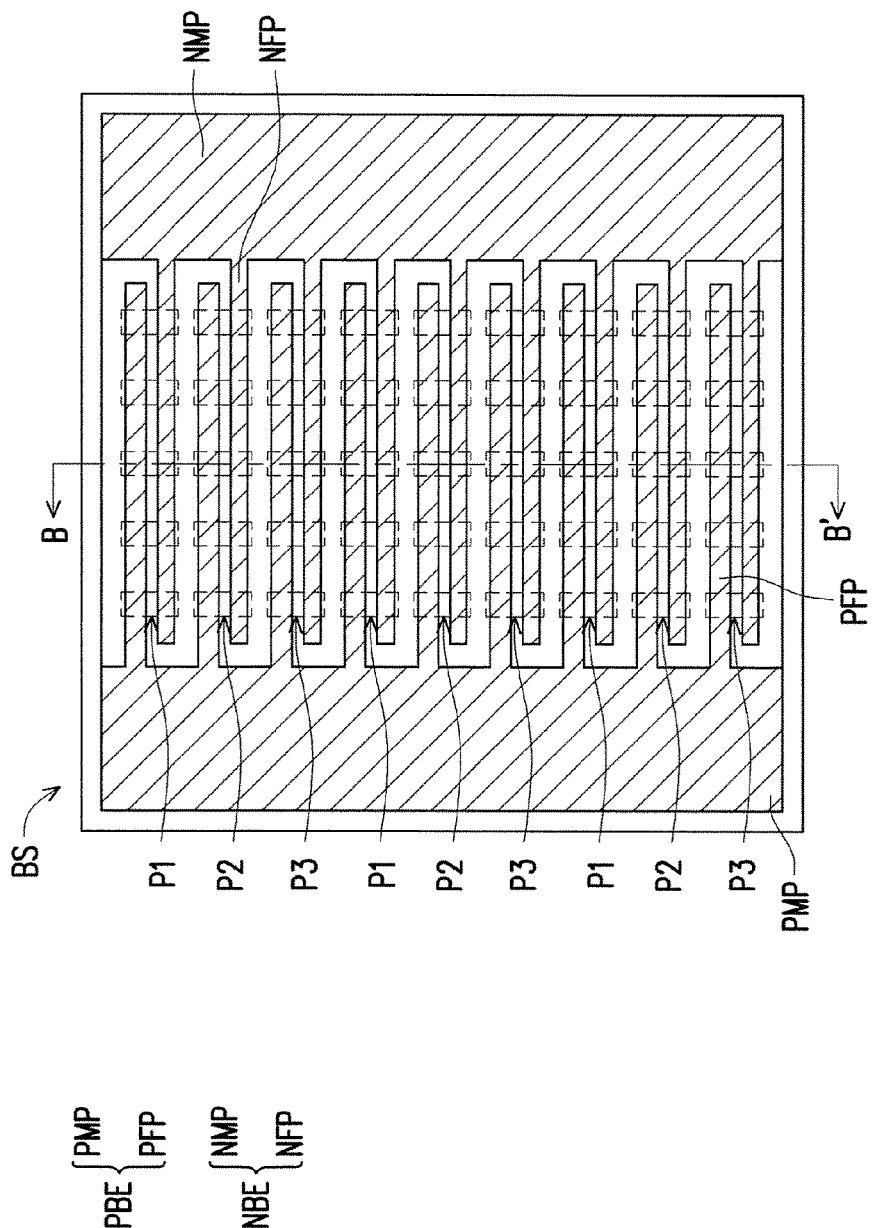
Figure 14A:
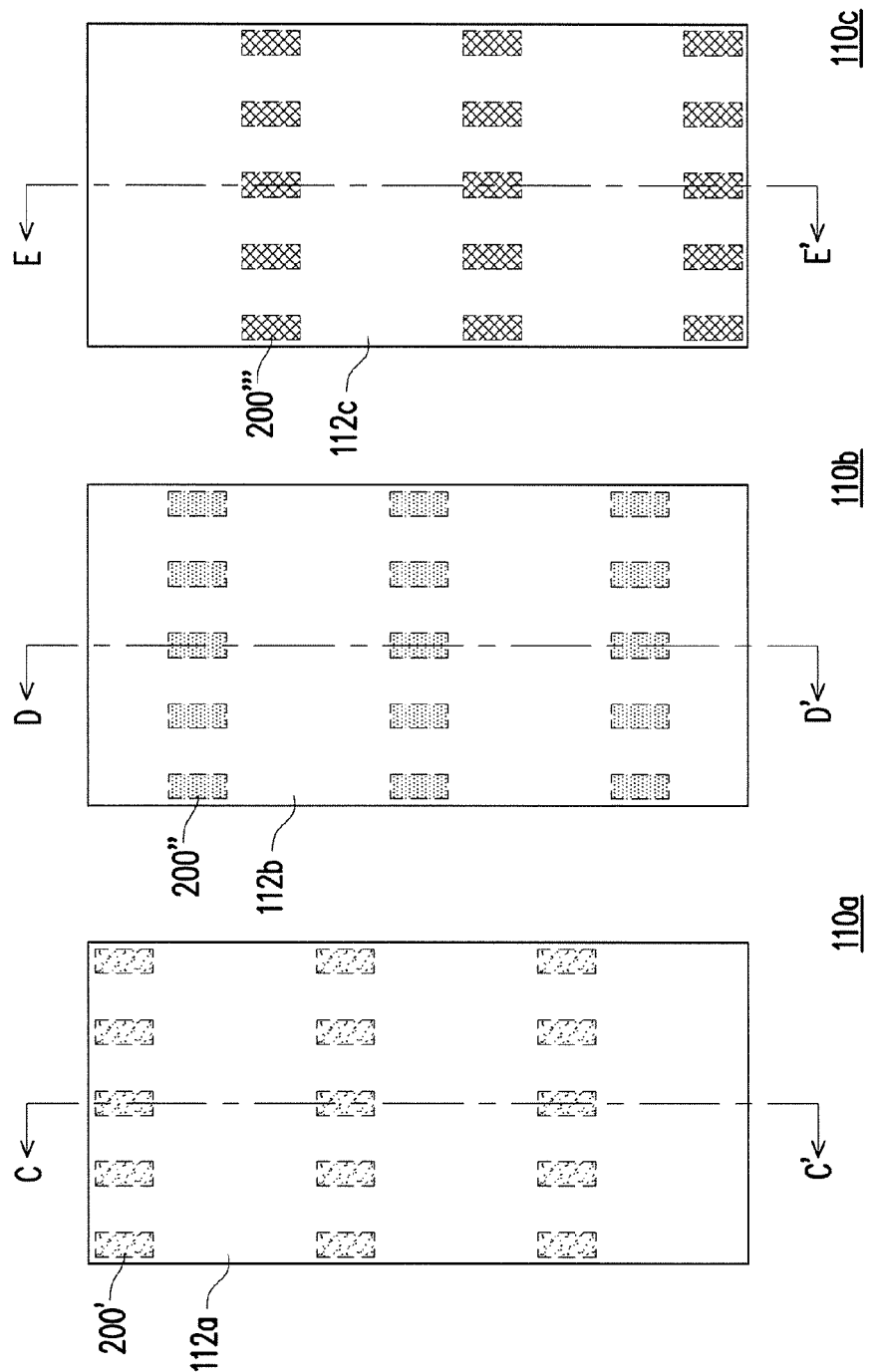
Figure 14B:
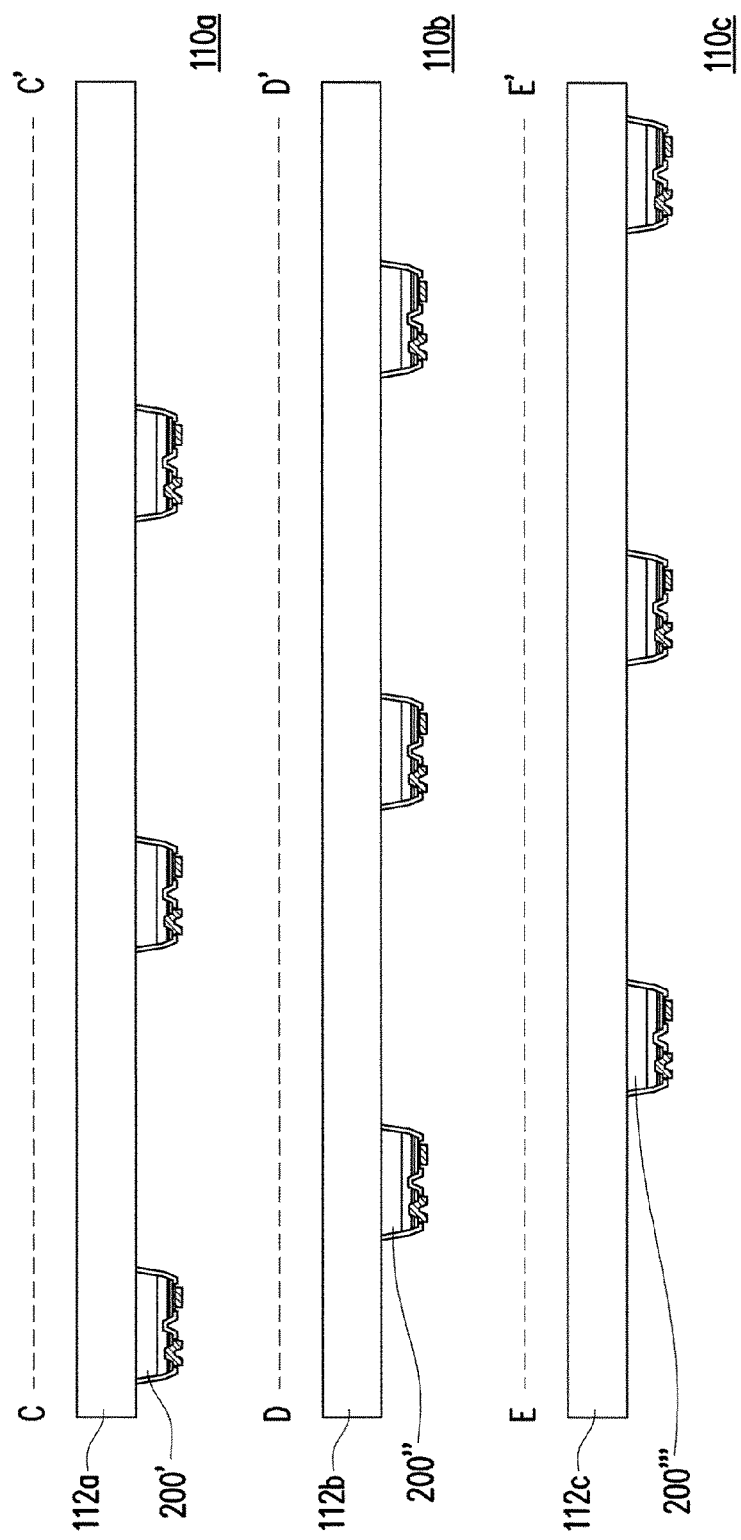

With reference to FIG. 12, FIG. 13A and FIG. 13B, in step S700, a carrying substrate BS is provided. The carrying substrate BS has a plurality of bonding electrode pairs BEP (a plurality of first bonding electrode pairs BEP1, a plurality of second bonding electrode pairs BEP2 and a plurality of third bonding electrode pairs BEP3). In detail, the carrying substrate BS includes a positive bonding electrode PBE and a negative bonding electrode NBE. With reference to FIG. 13B, the positive bonding electrode PBE has a positive electrode main portion PMP and a plurality of positive electrode finger portions PFP extending from the positive electrode main portion PMP and being arranged with intervals. The negative bonding electrode NBE has a negative electrode main portion NMP and a plurality of negative electrode finger portions NFP extending from the negative electrode main portion NMP and being arranged with intervals. The positive electrode finger portions PFP extend towards the intervals between the negative electrode finger portions NFP. The negative electrode finger portions NFP extend towards the intervals between the positive electrode finger portions PFP. The bonding electrode pair BEP is constituted by the positive electrode finger portion PFP and the negative electrode finger portion NFP adjacent to each other.

With reference to FIG. 12, FIG. 13B, FIG. 14A and FIG. 14B, in step S800, a blue micro light emitting diode wafer 110a (a first wafer), a green micro light emitting diode wafer 110b (a second wafer) and a red micro light emitting diode wafer 110c (a third wafer) are provided. The blue micro light emitting diode wafer 110a includes a first substrate 110a and a plurality of blue micro light emitting diodes 200'. The green micro light emitting diode wafer 110b includes a second substrate 110b and a plurality of green micro light emitting diodes 200". The red micro light emitting diode wafer 110c includes a third substrate 110c and a plurality of red micro light emitting diodes 200'". The blue micro light emitting diodes 200', the green micro light emitting diodes 200" and the red micro light emitting diodes 200'" are respectively arranged in a matrix on the first substrate 110a, the second substrate 112b and the third substrate 112c, and have positions projected on the carrying substrate BS respectively being a plurality of first positions P1, a plurality of second positions P2 and a plurality of third positions P3. The first positions P1 correspond to positions of the first bonding electrode pairs BEP1; the second positions P2 correspond to positions of the second bonding electrode pairs BEP2; and the third positions P3 correspond to positions of the third bonding electrode pairs BEP3. The first positions P1, the second positions P2 and the third positions P3 are alternately arranged on the carrying substrate BS.

In the present embodiment, both the first substrate 112a and the second substrate 112b are, for example, the sapphire substrate, and the third substrate 112c is, for example, a gallium arsenide substrate.

Figure 15A:
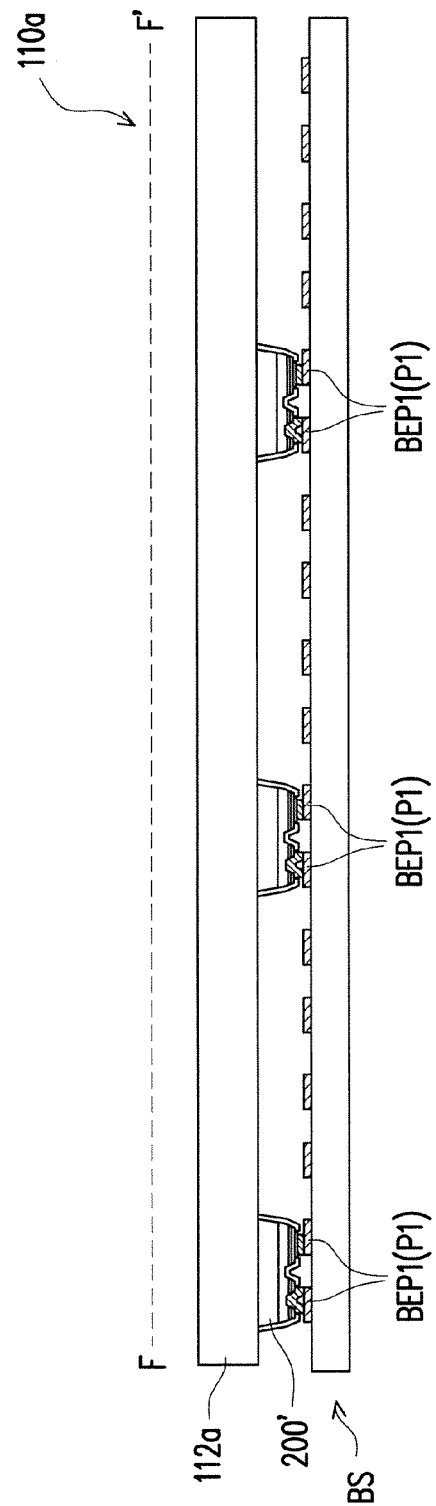
Figure 15B:
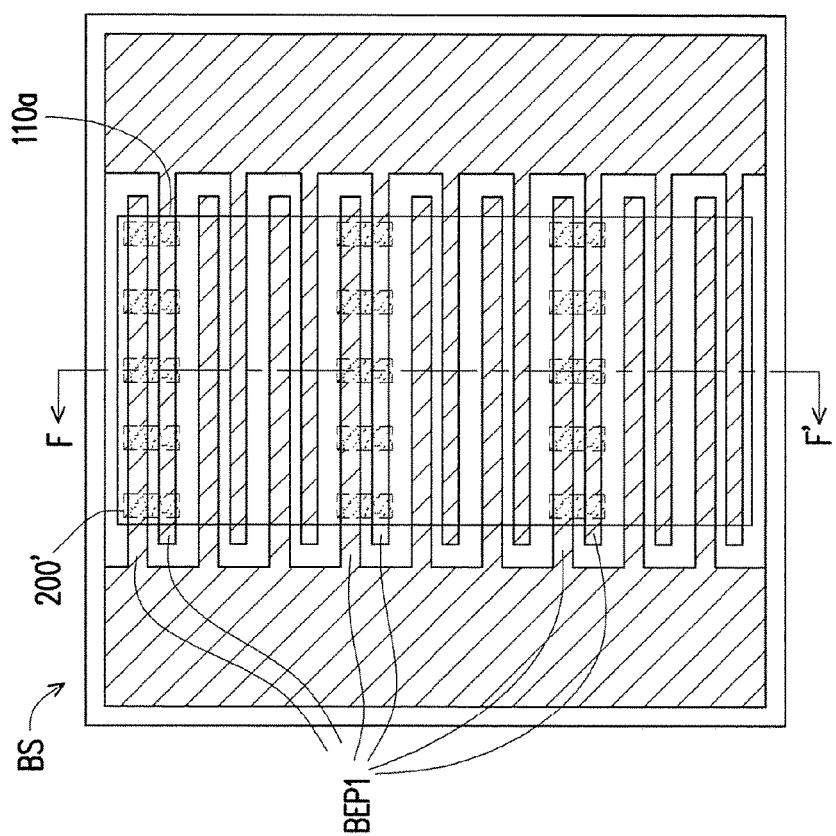
Figure 16A:
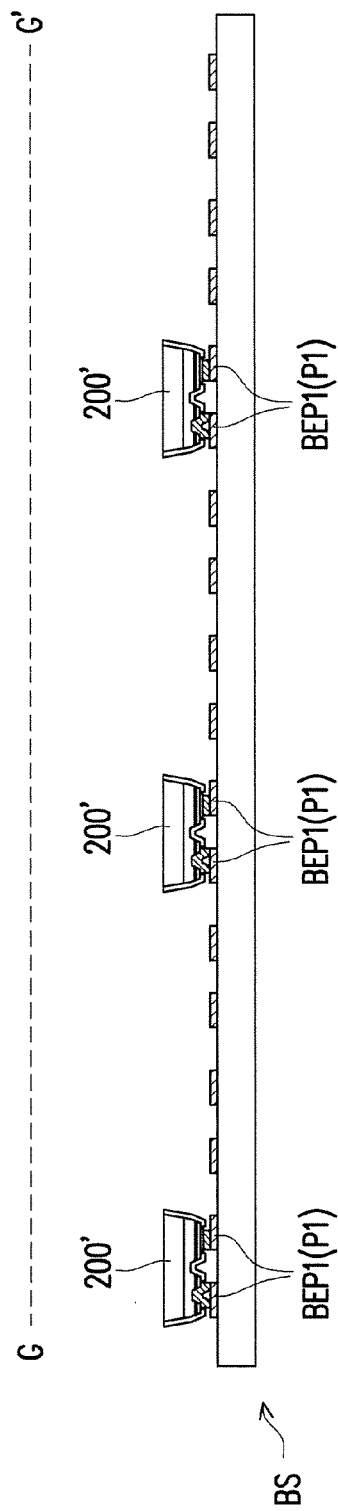
Figure 16B:
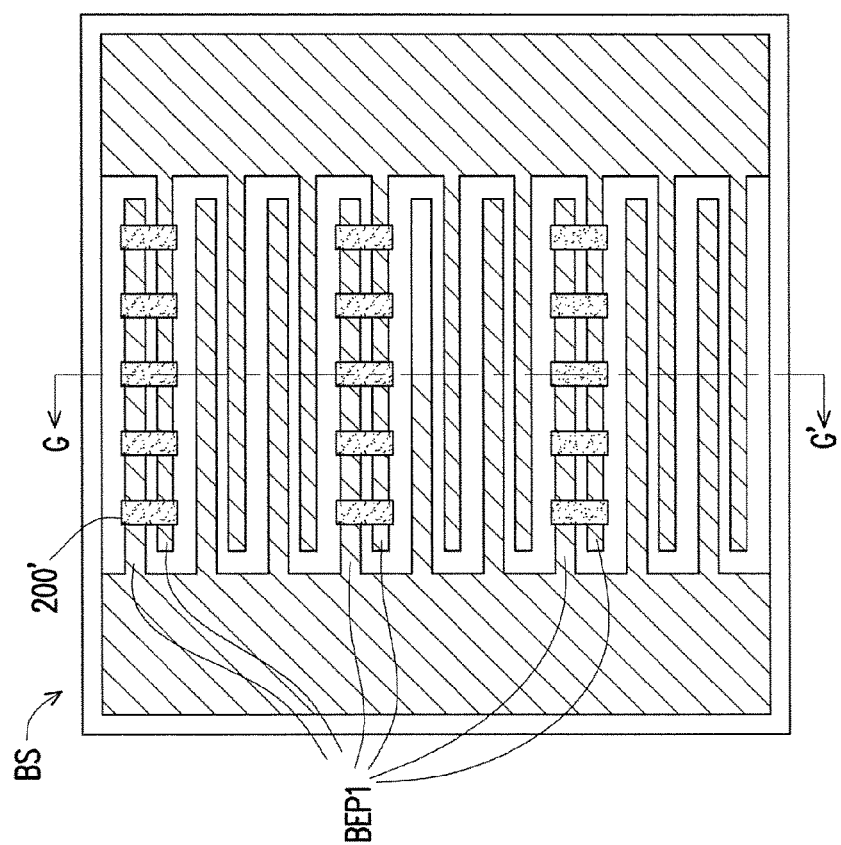

With reference to FIG. 12, FIG. 15A and FIG. 15B, in step S900, the blue micro light emitting diodes wafer 110a is bonded to the carrying substrate BS so that the blue micro light emitting diodes 200' are bonded to the first positions P1 through the first bonding electrode pairs BEP1. Herein, the bonding method may be, for example, a thermocompression, the reflow process or the anisotropic conductive film mentioned above. Next, with reference to FIG. 12, FIG. 16A and FIG. 16B, in step S1000, the first substrate 112a is removed. Herein, the removing method is, for example, a laser lift-off method, a photochemical reaction method or a photophysical reaction method.

Figure 17A:
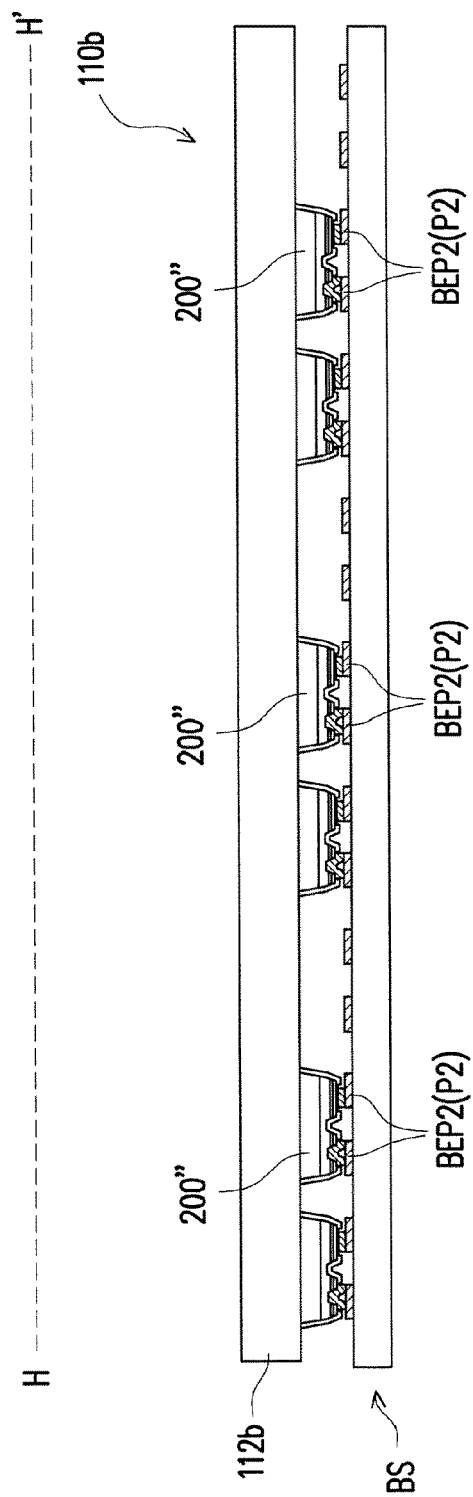
Figure 17B:
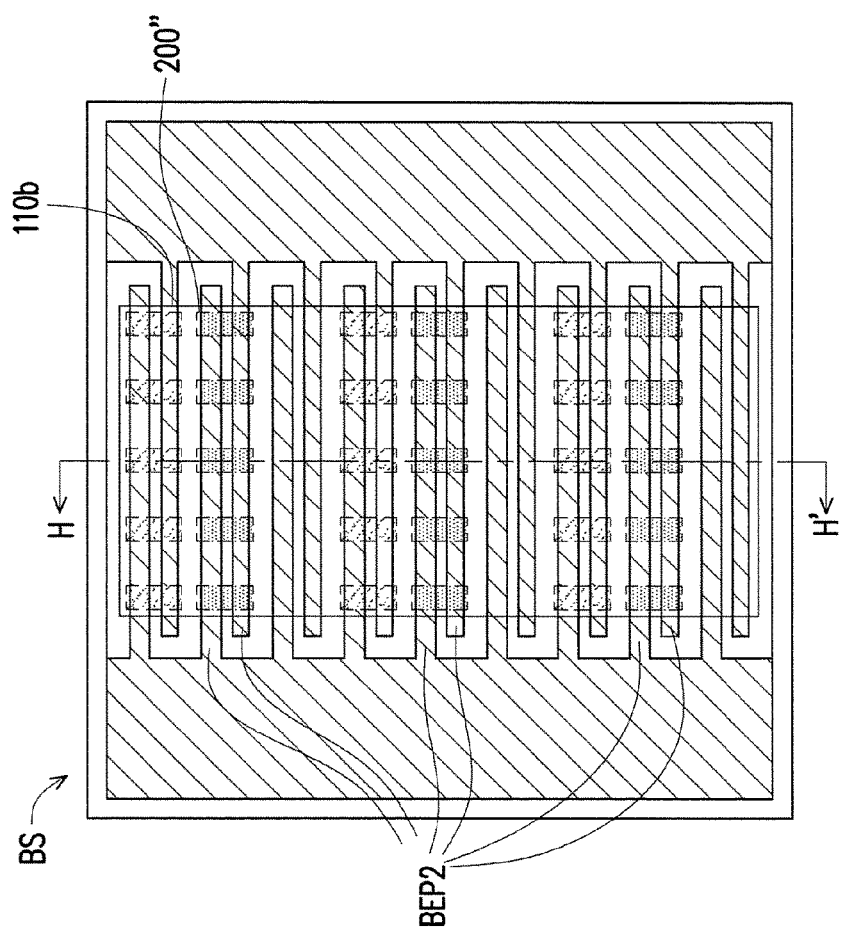

With reference to FIG. 12, FIG. 17A and FIG. 17B, in step S1100, the green micro light emitting diode wafer 110b is bonded to the carrying substrate BS so that the green micro light emitting diodes 200" corresponding to the second positions P2 are bonded to the second positions P2 through the second bonding electrode pairs BEP2. Herein, the bonding method may be, for example, a thermocompression, the reflow process or the anisotropic conductive film mentioned above. Next, with reference to FIG. 12, FIG. 18A and FIG. 18B, in step S1200, the second substrate 112b is removed. Herein, the removing method is, for example, a laser lift-off method, a photochemical reaction method or a photophysical reaction method.

Figure 18A:
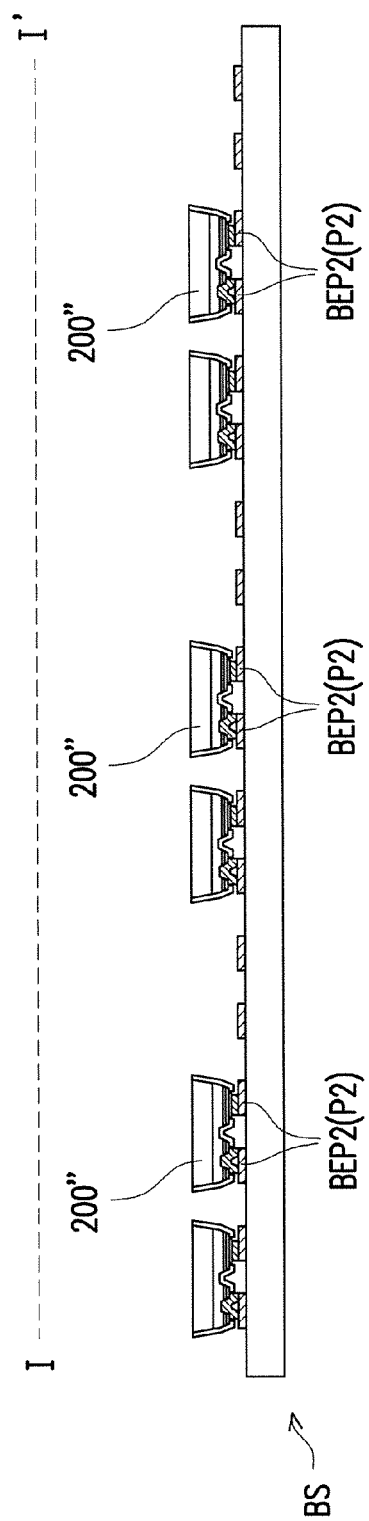
Figure 18B:
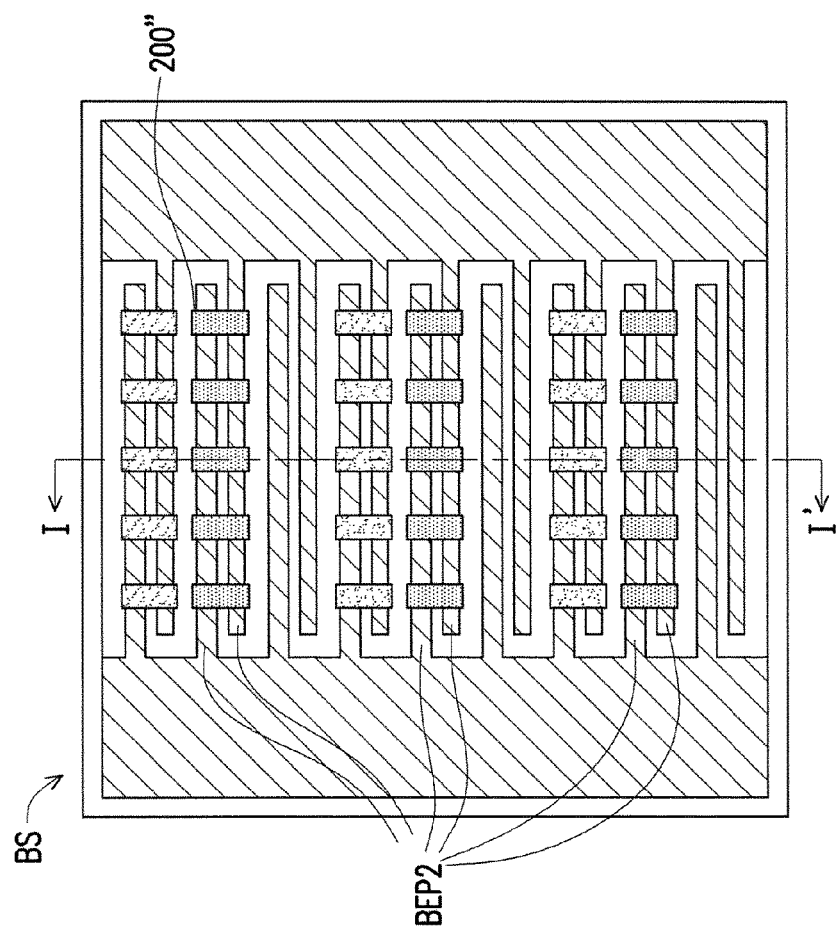
Figure 19A:
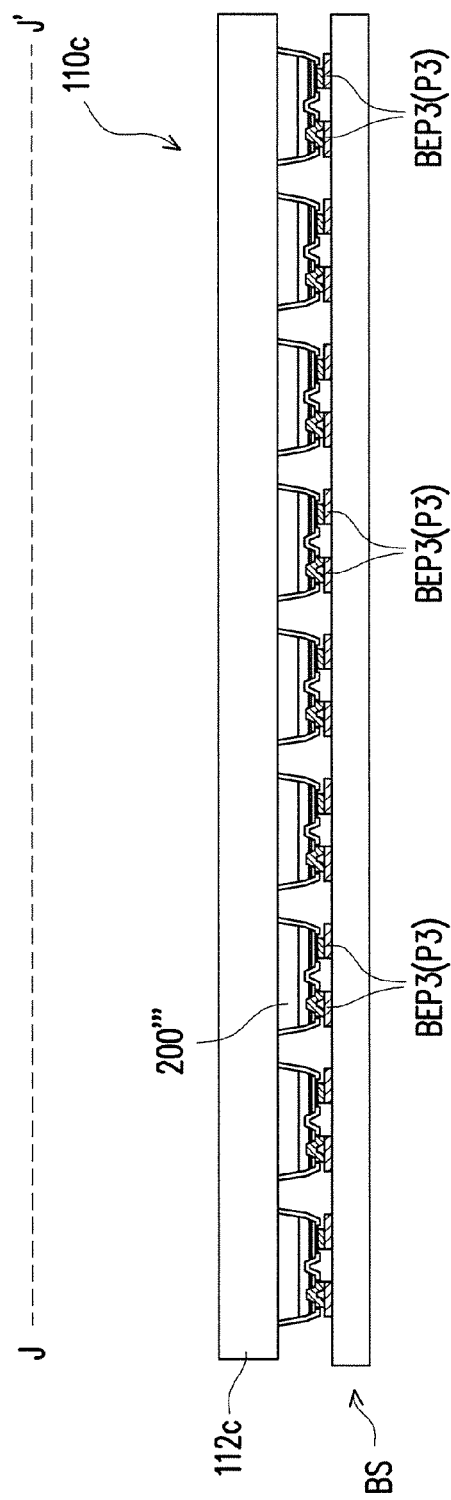
Figure 19B:
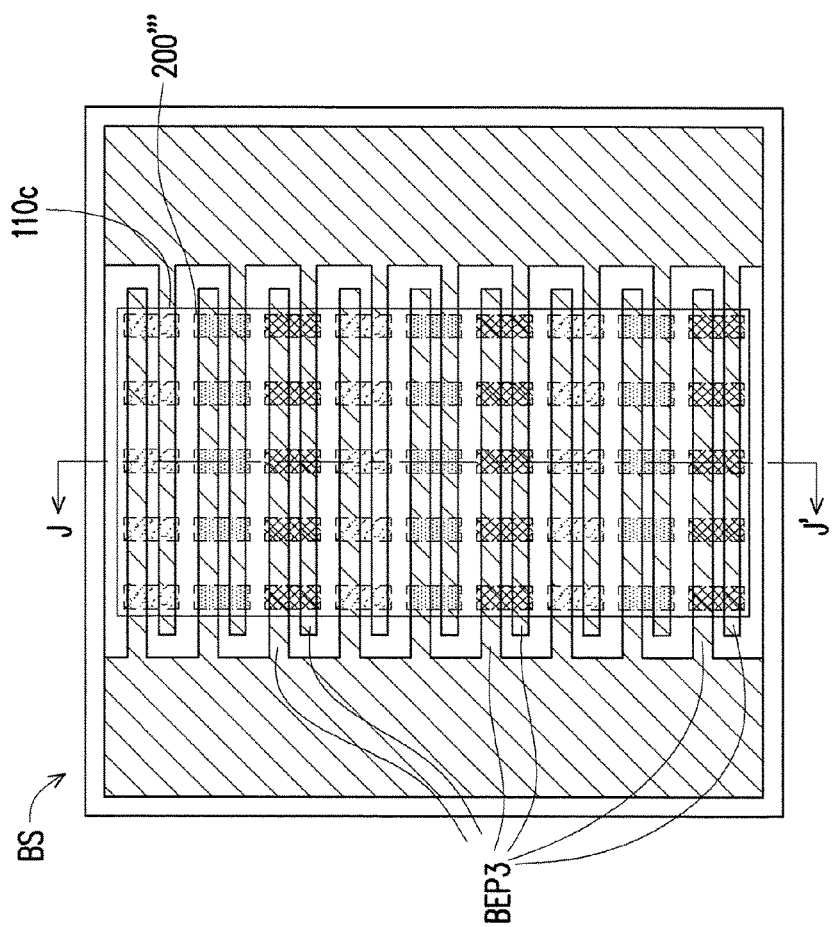
Figure 20A:
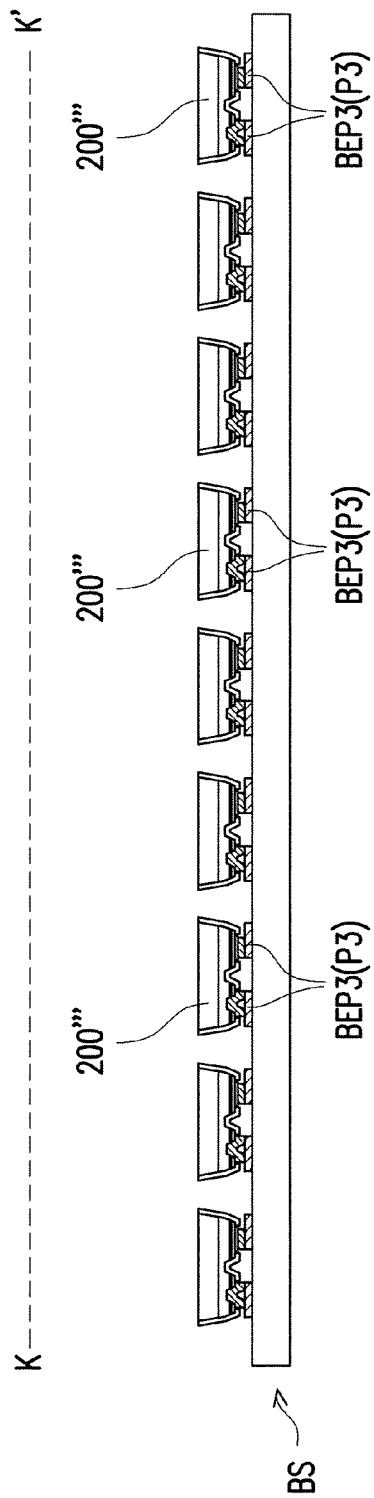
Figure 20B:
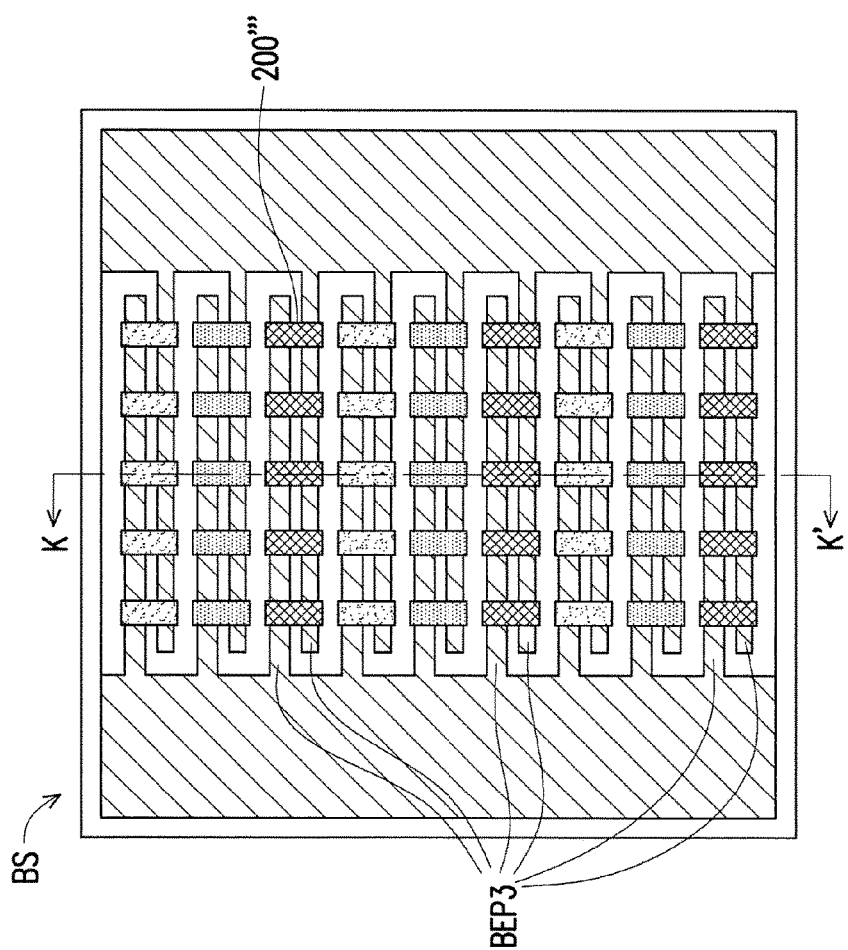

With reference to FIG. 12, FIG. 18A and FIG. 18B, in step S1300, the red micro light emitting diode wafer 110c is bonded to the carrying substrate BS so that the red micro light emitting diodes 200''' corresponding to the third positions P3 are bonded to the third positions P3 through the third bonding electrode pairs BEP3. Herein, the bonding method may be, for example, a thermocompression, the reflow process or the anisotropic conductive film mentioned above. Next, with reference to FIG. 12, FIG. 19A and FIG. 19B, in step S1400, the third substrate 112c is removed. The removing method is, for example, etching the third substrate 112c by aqueous ammonia ($NH_4OH$) and hydrogen peroxide ($H_2O_2$). Alternatively, the third substrate 112c may be removed through a chemical reaction, a physical reaction (removing the substrate by polishing) or a dry etching. At this point, the method of mass transferring electronic devices in the second embodiment of the invention is substantially complete.

It should be noted that, in the foregoing embodiments, the substrate (112a, 112b or 112c) in one single wafer (110a, 110b or 110c) may be removed right after said one single wafer (110a, 110b or 110c) is bonded onto the carrying substrate BS. In other embodiments, it is also possible that the corresponding micro light emitting diodes 200, 200' and 200" may be bonded to the carrying substrate BS in sequence or all at once through a suction or adhesive apparatus or a sucker after all the substrates (110a, 110b and 110c) in all the wafers (110a, 110b and 110c) are removed. A priority of the step for removing the substrate (112a, 112b or 112c) may be decided according to actual requirements, and the invention is not limited thereto.

In the method of mass transferring electronic devices according to the second embodiment of the invention, the first electronic devices in the first wafer are projected to the first positions on the carrying substrate which are different from the second positions on the carrying substrate where the second electronic devices are projected to. Then, the first electronic devices on the second wafer and the second electronic devices on the second wafer are transferred onto the carrying substrate in sequence. In this way, the first electronic devices and the second electronic devices may be transferred onto the carrying substrate rapidly and more accurately without using the time-consuming transferring method mentioned in Description of Related Art—in which all the micro light emitting diodes are individually picked up and aligned on the backplane of the display panel, or the transferring method with inaccurate alignment also mentioned in Description of Related Art—in which all the micro light emitting diodes are directly transferred onto the backplane in large area. Moreover, with the disposition described above, when the not-yet-bonded wafer is to be bonded to the carrying substrate, the electronic devices on the not-yet-bonded wafer are less likely to be in contact with the electronic devices already bonded to the carrying substrate, and thus the transferring yield rate may be improved. Accordingly, the electronic devices (e.g., the micro light emitting diode display panel) manufactured with the method of mass transferring electronic devices in the second embodiment of the invention may be low in manufacturing costs and high in yield rate.

In summary, in the methods of mass transferring electronic devices according to the embodiments of the invention, the mass electronic devices are transferred onto the carrying substrate in sequence. In this way, the methods of mass transferring electronic devices according to the embodiments of the invention may be used to rapidly and accurately transfer the mass electronic devices onto the carrying substrate. As a result, the electronic devices manufactured with the methods of mass transferring electronic devices according to the embodiments of the invention may be low in manufacturing costs and high in yield rate.

Although the present invention has been described with reference to the above embodiments, it will be apparent to one of the ordinary skill in the art that modifications to the described embodiments may be made without departing from the spirit of the invention. Accordingly, the scope of the invention is defined by the attached claims not by the above detailed descriptions.

What is claimed is:

1. A method of mass transferring electronic devices, comprising:
   providing a wafer comprising a substrate and a plurality of electronic devices, the electronic devices being arranged in a matrix on a surface of the substrate;
   attaching the wafer to a temporary fixing film;
   cutting the wafer so that the wafer is divided into a plurality of blocks, each of the blocks comprising at least a part of the electronic devices and a sub-substrate;
   stretching the temporary fixing film so that the blocks on the temporary fixing film are separated from each other as the temporary fixing film is stretched;
   selecting at least a part of the blocks as a predetermined bonding portion, and transferring each of the blocks in the predetermined bonding portion to a carrying substrate in sequence, so that the electronic devices in the predetermined bonding portion are bonded to the carrying substrate;

removing the sub-substrates of the blocks in sequence, comprising peeling off the sub-substrates in the blocks by using a laser lift-off method, a photochemical reaction method or a photophysical reaction method, wherein after the step of removing the sub-substrates of the blocks in sequence, the electronic devices in the blocks have a plurality of surfaces exposed, and a metal is generated on the surfaces; and removing the metal.

2. The method of mass transferring electronic devices according to claim 1, wherein the step of cutting the wafer so that the wafer is divided into the blocks comprises:

forming a plurality of marks on the wafer by using a laser scribing method, a photochemical reaction method or a photophysical reaction method; and splitting the wafer into the blocks along the marks by a splitting apparatus.

3. The method of mass transferring electronic devices according to claim 2, wherein the step of forming the marks on the wafer by the laser scribing method comprises:

focusing a laser on the surface of the substrate so as to form the marks on the surface of the wafer.

4. The method of mass transferring electronic devices according to claim 2, wherein the step of forming the marks on the wafer by the laser scribing method comprises:

focusing a laser on an internal portion of the substrate so as to form the marks on the internal portion of the wafer.

5. The method of mass transferring electronic devices according to claim 1, wherein a plurality of electrode pairs of the electronic devices in the predetermined bonding portion are respectively bonded to a plurality of bonding electrode pairs of the carrying substrate through a thermocompression.

6. The method of mass transferring electronic devices according to claim 5, wherein a bonding method of the electrode pairs and the bonding electrode pairs is a eutectic bonding or a solder process.

7. The method of mass transferring electronic devices according to claim 5, wherein the thermocompression comprises a reflow process using a solder.

8. The method of mass transferring electronic devices according to claim 5, wherein the electrode pairs and the boding electrode pairs are electrically boned through an anisotropic conductive film.

9. The method of mass transferring electronic devices according to claim 1, wherein a number of the electronic devices in each of the blocks falls within a range of 1 to $5 \times 10^6$.

10. A method of mass transferring electronic devices, comprising:

providing a carrying substrate, the carrying substrate having a plurality of bonding electrode pairs, the bonding electrode pairs comprising a plurality of first bonding electrode pairs and a plurality of second bonding electrode pairs;

providing a first wafer and a second wafer, the first wafer comprising a first substrate and a plurality of first electronic devices arranged in a matrix on the first substrate, the second wafer comprising a second substrate and a plurality of second electronic devices arranged in a matrix on the second substrate, wherein positions of the first electronic devices projected on the carrying substrate are respectively a plurality of first positions, the first positions correspond to positions of the first bonding electrode pairs, positions of the second electronic devices projected on the carrying substrate are respectively a plurality of second positions, the second positions correspond to positions of the second bonding electrode pairs, and the first positions are different from the second positions;

bonding the first wafer and the second wafer to the first bonding electrode pairs and the second bonding electrode pairs on the carrying substrate in sequence, so that the first electronic devices and the second electronic devices are respectively bonded to the carrying substrate; and removing the first substrate in the first wafer and the second substrate in the second wafer.

11. The method of mass transferring electronic devices according to claim 10, wherein the bonding electrode pairs further comprise a plurality of third bonding electrode pairs, and the step of providing the first wafer and the second wafer further comprises: providing a third wafer, the third wafer comprising a third substrate and a plurality of third electronic devices arranged in a matrix on the third substrate, wherein positions of the third electronic devices projected on the carrying substrate are respectively a plurality of third positions, the third positions correspond to positions of the third bonding electrode pairs, and the third positions are different from the first positions and the second positions.

12. The method of mass transferring electronic devices according to claim 11, wherein after the step of bonding the first wafer and the second wafer to the first bonding electrode pairs and the second bonding electrode pairs on the carrying substrate in sequence, the method further comprises: bonding the third electronic devices on the third wafer to the third electrode pairs on the carrying substrate.

13. The method of mass transferring electronic devices according to claim 11, further comprising: removing the third substrate in the third wafer.

14. The method of mass transferring electronic devices according to claim 10, wherein the carrying substrate comprises a positive bonding electrode and a negative bonding electrode, the positive bonding electrode has a plurality of positive electrode finger portions arranged with intervals, the negative bonding electrode has a plurality of negative electrode finger portions arranged with intervals, the positive electrode finger portions extend towards the intervals between the negative electrode finger portions, the negative electrode finger portions extend towards the intervals between the positive electrode finger portions, and each of the bonding electrode pairs is constituted by the positive electrode finger portion and the negative electrode finger portion adjacent to each other.

* * * * *